United States Patent [19]
Aikawa et al.

[11] Patent Number: 5,563,682
[45] Date of Patent: Oct. 8, 1996

[54] EXPOSING APPARATUS WITH MASK ALIGNMENT SYSTEM AND METHOD OF ALIGNING, EXPOSING AND TRANSFERRING WORK

[75] Inventors: Nobutoshi Aikawa; Akira Morita, both of Choufu, Japan

[73] Assignee: ORC Manufacturing Co., Ltd., Tokyo, Japan

[21] Appl. No.: 430,912

[22] Filed: Apr. 27, 1995

[30] Foreign Application Priority Data

Jul. 29, 1994 [JP] Japan .................... 6-178863

[51] Int. Cl.⁶ .......................... G03B 27/42; G03B 27/04; G01B 11/00
[52] U.S. Cl. .................. 355/53; 355/95; 356/400
[58] Field of Search .................. 355/53, 86, 89, 355/91, 95; 356/400, 401; 250/548; 29/720, 721, 593

[56] References Cited

U.S. PATENT DOCUMENTS

| | | | |
|---|---|---|---|
| 4,541,714 | 9/1985 | Miyamoto | 355/99 |
| 4,677,303 | 6/1987 | Erdman | 250/561 |
| 4,996,763 | 5/1991 | Sano et al. | |
| 5,031,334 | 7/1991 | Takamura | |
| 5,222,293 | 6/1993 | Ozimek et al. | 29/833 |
| 5,329,126 | 7/1994 | Amemiya et al. | 250/453.11 |
| 5,390,025 | 2/1995 | Morita et al. | 356/400 |

FOREIGN PATENT DOCUMENTS 0516317 12/1992 European Pat. Off. .
4-350857 4/1992 Japan .

OTHER PUBLICATIONS

Patent Abstracts of Japan, vol. 005 No. 110 (P–071); Jul. 17, 1981; JP-A-56 051732, pub. May 1981.

*Primary Examiner*—Arthur T. Grimley
*Assistant Examiner*—David A. Lane
*Attorney, Agent, or Firm*—Longacre & White

[57] ABSTRACT

In an exposing apparatus including an alignment stage A, an exposing stage B, transferring mechanisms 10 and 11 provided in the alignment stage and the exposing stage, a light source device 9, and an image-taking device for taking the images of the work W from the top of the work, the exposing apparatus further including a retaining mechanism for holding a mask film M from the top of the mask film, the retaining mechanism comprising a suction unit 5a for sucking the mask film, a supporting arm 17 for supporting the suction unit so as to be movable up and down, a first driving device 14 for moving the supporting arm up and down, a second driving device vice 15 for moving the first driving device up and down, and a stopper supporting unit 20 for fixing and supporting the suction unit at a predetermined position of the suction unit, so that this apparatus occupies a small space, and the work is accurately aligned with the mask film, and the upper and lower frames do not need to be opened and closed in the alignment stage, and the positional deviation of the work and the mask film does not occur, and the causes of deteriorating a coherent film of an optical system in early stage is decreased, and the vertical light can irradiate the work in the exposing stage even though the apparatus is made small.

13 Claims, 14 Drawing Sheets

EXPOSING APPARATUS WITH MASK ALIGNMENT SYSTEM AND METHOD OF ALIGNING, EXPOSING AND TRANSFERRING WORK

BACKGROUND OF THE INVENTION

1. Field of the Invention

The present invention relates to an exposing apparatus for exposing one sides of works, and more particularly to an exposing apparatus with mask alignment system which comprises an alignment system for aligning a mask film on which an exposing pattern is formed and a method of aligning, exposing and transferring a work.

2. Prior Art

The process of exposing a work with a predetermined exposing pattern of a mask film is generally carried out in different stages: alignment stage and exposing stage. That is, as shown in FIG. 14, locating marks of the work W and mask film M are taken by cameras 68 in the alignment apparatus 67, and the work W is aligned with the mask film M using a monitor 69, an alignment table and others. Thereafter, the aligned work and mask film are stored in storage spaces 66 of a stock-unit 65 and the stock-unit 65 is moved to an exposing apparatus 60 and the work is exposed by the exposing apparatus 60.

In the exposing apparatus 60, a vacuum frame for holding the work W is arranged such that one side of an upper transparent frame plate 61 is pivotally placed at one side of a lower transparent frame plate 62 with a hinge 63 so that the upper transparent frame plate 61 is opened and closed. The upper transparent frame plate 61 is formed in a square shape and comprises an upper transparent plate 61a. The work W and the mask film M are held between both frame plates 61 and 62 by sucking air in the space surrounded by the upper transparent plate 61a and sealing rubber. The work W is transfered to the exposing stage in the exposing apparatus while held between the upper and lower frame plates 61 and 62 and then exposed therein.

Some of the exposing apparatus comprise an alignment system. As shown in FIG. 15, in the exposing apparatus 70, cameras 72 and an alignment table 71 are placed at the lower part in the alignment stage, so that the images of the mask film on the work is taken from the bottom thereof. Therefore, it is required to form holes at predetermined positions in the work W to be exposed.

Further, in the exposing apparatus 70, the upper transparent frame plates 74 are provided so as to reciprocate on respective transfering paths 75 which are provided horizontally from the alignment stage to the exposing stage, and the frame plate 74 is pivotally moved with a fixed rotating part 74a, as shown by imaginary lines. One of the lower frame plates 73 each holding the work W with the upper transparent frame plate 74 is placed in the alignment stage, and the other lower frame plate 73, together with the upper frame plate 61 is placed in the exposing stage.

The mask film is fixed on the respective transparent plate of the upper transparent frame plate 74. Further, in the exposing stage, because the distance between a reflector and the work W is different, two photometers 77 are provided to control a light source so that the product of light quantities is always the same even the locations of the works are different.

There is provided a cooling housing for cooling a surface of a work W, next to the exposing stage. There are placed a cooling apparatus 79, a cooling fan and others in the cooling housing. A light source housing is provided next to the cooling housing. There are a light source device 78, a flyeye lens 78a, a reflector 78b and others inside the light source housing. Light from the light source device 78 irradiates a curved-reflector 78e for reflecting light in a direction perpendicular to the work W at the upper part of the light source housing.

It should be noted that the reasons for providing the cooling housing between the exposing stage and the light source housing are that the exposing stage needs to be separated apart from the light source by a predetermined distance on the requirement of irradiating the work with vertical light and that the surface of the work, the light source device and others need to be cooled.

However, there exist the following problems in the above-described exposing apparatus.

(1) With respect to the exposing apparatus-alignment apparatus separating type, spaces for the alignment apparatus and stock-unit are needed. Further, transferring the aligned work and mask film with the stock-unit causes dusts attached on the mask film and the work. Furthermore, positional deviation of the work and mask film occurs during the transfer of the aligned work and mask film.

(2) With respect to the exposing apparatus comprising image-taking means in the alignment stage, since the image-taking means is provided under the work, a process of forming holes at predetermined positions of the work is required. Therefore, working steps are increased and the apparatus for forming holes is needed. Further, if the hole is small, an irradiation beam does not pass through, and if it is large, it is inconvenient for designing circuits. Since the holes are formed with a drill, burr occurs, which scatters irradiation light. Due to this, the locating mark of the mask film cannot be read with the image-taking means, and the alignment process is failed.

(3) In the structure of the exposing apparatus, there is a process of opening and closing the upper and lower frame plates in the alignment stage (in FIG. 15, an exposing apparatus transferring position). Closing and opening the upper and lower frames takes time, which lowers the processability of works.

(4) With respect to the exposing apparatus comprising the alignment table, since the upper transparent frame plate provided with the mask film is opened and closed around the one side thereof as the rotatable support section, the pre-alignment cannot be performed. The position of the locating mark of the work to be mounted on the lower frame plate is hardly aligned with the position of the locating mark of the mask film, and the alignment process with the image-taking means may not be performed, depending upon the placement of the work.

(5) With respect to the exposing apparatus comprising the alignment stage, after the work on the lower frame plate is aligned on the alignment table, the lower frame plate and the upper transparent frame plate are combined to hold the work and the mask film. However, when the work and the mask film are vacuum-sucked between the upper and lower frames, positional deviation often occurs, and the alignment process needs to be repeated, which makes the work exposing process longer.

(6) The light source device of the exposing apparatus cannot irradiate the surface of the work with light unless the lamp is placed apart from the surface of the work by a predetermined distance; however, with the placement of the cooling stage between the exposing stage and the light source device, the exposing apparatus would be large.

Further, the lamp and the reflector comprise a coherent film, a vapor-deposited film and others in order to emit light in a predetermined direction. When the cooling housing and the light source housing are placed in the different locations, heat from the lamp and humidity are not adequately removed. This causes the coherent film and the vapor-deposited film coming off from the lamp and the reflector.

(7) In the case of exposing the work in the exposing stage, the light source is controlled to make the product of light quantities always the same because the distance from the light source is different. If possible, it is preferable to fix the distance between the work and the light source. The apparatus which employs this structure is expected.

The present invention has been achieved to solve the above-stated problems. It is an object of the present invention to provide an exposing apparatus with mask alignment system and a method of aligning, exposing and transferring a work, which do not occupy a large space and which accurately align the work with the mask film, and which do not require the process of closing and opening the upper and lower frames in the alignment stage, and which do not cause the positional deviation of the work and mask film after aligned, and which minimize the causes of the deterioration of the coherent film, e.g., humidity and heat from the light, and which irradiate the work in the exposing stage with light without making the size of the apparatus larger.

SUMMARY OF THE INVENTION

An exposing apparatus with mask alignment system of the present invention comprising an alignment stage for aligning a work with a mask film, an exposing stage for exposing the aligned work, a transferring mechanism for transferring the work between the alignment stage and the exposing stage, a light source device for irradiating the work with light in the exposing stage, and image-taking means for taking images of the work and the mask film from the top of the work and the mask film in the alignment stage comprises a retaining mechanism for retaining the mask film from the top of the mask film, provided in the alignment stage, and the retaining mechanism further comprises a suction unit for sucking the mask film, a supporting arm for supporting the suction unit so as to be movable up and down, a first driving device for moving the supporting arm up and down, a second driving device for moving the first driving device up and down, and a stopper supporting unit for fixing and supporting the suction unit when the suction unit is moved to a predetermined position.

The supporting arm may comprise a guide unit for sliding the suction unit up and down, and ends of an elastic material may be coupled to the suction unit and the supporting arm so that the suction unit is pressed towards the mask film by the elastic material. The stopper supporting unit may comprise a stopper arm retractable horizontally, and a stopper arm driving unit for driving the stopper arm. The suction unit slid along the guide unit may be fixed and supported by the stopper arm at a predetermined position.

Alternatively, an alignment table to be lifted up from the bottom of the transferring paths to the top of the transferring paths is provided in the alignment stage, and a vertical transferring table to be lifted up from the bottom of the transferring paths to the top of the transferring paths and upper transparent frame plates for forming a vacuum frame when combined with the respective first and second lower frame plates are provided in the exposing stage.

The movable table may comprise a mounting plate for mounting the lower frame plate, and a positioning guide for the lower frame plate provided at the predetermined position of the mounting plate. The lower frame plate may have rotative rollers the rotating faces of which protrude.

The image-taking means provided in the alignment stage comprises two cameras, and a lightning device for irradiating focal points of the cameras. The cameras are supported with a supporting member. The supporting member is provided on a slide unit which is provided along the longitudinal direction of a movable arm so as to be movable. A proximal portion of the movable arm is provided at a horizontal groove perpendicular to the longitudinal direction of the movable arm. The lightning device is provided at a predetermined position of the supporting member so as to be moved up and down, and the lightning device irradiates locating marks of the work and the mask film when the lightning device is moved to the lowest position while the camera takes the images of the work and mask.

The lower frame plate mounting the work comprises protrusions to be in contact with the side faces of the work at a predetermined position, and a lightning device for pinpointing a locating mark of the work with collimated light, provided in the vicinity of the image-taking means.

A reflector having a curved surface for reflecting light emitted from a lamp of the light source device in a predetermined direction is provided in the exposing stage, and a cooling device having a radiator is provided in a light source housing provided adjacent to the exposing stage. The center of the light source device is arranged at a position deviated right or left from the center of the width of the exposing apparatus. A first reflector for reflecting light emitted from the lamp at a predetermined angle reflects the light in a direction parallel to one end face of the work and closer to the work than a plane perpendicular to an optical axis of the light emitted from the lamp.

A method of aligning a work of the present invention comprises a first step of separating a lower frame plate from a movable table as an alignment table is lifted up and mounting the lower frame plate on the alignment table when the movable table for transferring the lower frame plate along transferring paths provided horizontally at different height is moved to a distal end, a second step of mounting the work on the lower frame plate by bringing end faces of the work into contact with protrusions provided along sides of the lower frame plate and aligning locating marks of the work with pinpointing collimated beams, a third step of mounting a mask film on the work by aligning the locating marks of the mask film with the collimated beams for prealignment, a fourth step of performing an alignment process by taking the images of the locating marks of the work and the mask film by image-taking means, lowering a retaining mechanism towards the mask film to suck the mask film, lifting up the retaining mechanism to separate the mask film from the work, operating the alignment table in X-, Y- and θ-directions in accordance with the locations of the locating marks, and a fifth step of lowering the retaining mechanism to bring the mask film in contact with the work, fixing and holding the work and the mask film on the lower frame, releasing the suction of the retaining mechanism, and lifting up the retaining mechanism.

A method of exposing a work of the present invention comprises a first step of separating and lifting up a lower frame plate holding aligned work and mask film from a movable table as a vertical transferring table is lifted up, and combining the lower frame plate with an upper transparent frame plate provided above the work and mask when the movable table for transferring the lower frame plate along transferring paths provided horizontally at different height is moved to a distal end, a second step of exposing the work with a predetermined pattern of the mask film by irradiating the work with light from a light source device through an optical system, and a third step of separating the lower frame plate from the upper transparent frame plate and mounting the lower frame plate on the movable table as the vertical transferring table is lowered.

A method of transferring a work of the present invention comprises a first step of moving one of lower frames mounted on respective first and second movable tables towards an alignment table in an alignment stage and moving the other lower frame towards a vertical transferring table in an exposing stage by moving the first and second movable tables along transferring paths provided at different height between the alignment stage and the exposing stage, a second step of, in the exposing stage, separating and lifting up the lower frame from the first movable table as the alignment table is lifted up, aligning a work with a mask film by operating the alignment table with a retaining mechanism for aligning the mask film, and fixing the work and the mask film on the lower frame with fixing means, and in the exposing stage, separating and lifting up a lower frame plate holding the aligned work from the second movable table as the vertical transferring table is lifted up, combining the lower frame plate with an upper transparent frame plate provided above the lower frame to sandwich the work and the mask film, and vacuum-sucking the work and the mask film, a third step of, in the alignment stage, lowering the lower frame holding the aligned work and mask film as the alignment table is lowered and mounting the lower frame on the first movable table, and in the exposing stage, releasing the vacuum-suction of the vacuum frame, lowering the lower frame holding the exposed work and mask film as the vertical transferring table is lowered and mounting the lower frame on the second movable table, and a fourth step of transferring the first movable table from the alignment stage to the exposing stage along the transferring paths, and transferring the second movable table from the exposing stage to the alignment stage.

The present invention has the following operations.

(1) In the retaining mechanism for retaining the mask film, the suction unit provided at the supporting arm so as to be movable up and down is lowered by a predetermined length by the first driving device to be brought into contact with the mask film mounted on the work, and the stopper supporting unit supports the suction unit at the location where the suction unit sucks the mask film. Then, the mask film, together with the supporting arm is lifted up by the first driving device to the position at which the exposing pattern of the mask film is not affected even the work is moved horizontally by the alignment table.

(2) In the case that the supporting arm is lowered by the first driving device in order to make the suction unit always pressed towards the mask film by the elastic material, the suction unit is accurately brought into contact with the mask film.

(3) The movable tables alternately transferred along the upper and lower transferring paths comprise the positioning guides at the predetermined positions of the mounting plate.

Accordingly, when the alignment table and the vertical transferring table placed in the alignment stage and the exposing stage to which the transferring tables are transferred are lifted up above the upper and lower transferring paths, the lower frame plates supported by the positioning guides are separated apart from the respective movable plates and mounted on the alignment table and the vertical transferring table. When the alignment table and the vertical transferring table on which the lower frame plates are mounted are lowered, the lower frame plates are guided by the positioning guides to be mounted on the transferring tables.

(4) When the rotative rollers are utilized as the positioning guide, the side faces of the lower frame plate are guided by the rotative rollers, so that the lower frame plate is mounted and supported on the movable plate and separated apart from the movable table as the alignment table and the vertical transferring table are moved vertically.

(5) In the image-taking means provided in the alignment stage, the supporting means of the camera is movable along the longitudinal direction of the movable arm, and the proximal portion of the movable arm is movable to the horizontal groove. Accordingly, the focal point of the camera provided at the supporting arm can be moved to the desired position. Since in the supporting means the annular lightning device is provided so as to be movable up and down, when the locating marks of the work and the mask film are taken by the camera, the lightning device irradiates the locating marks at its lowest position.

(6) The work is mounted on the lower frame plate by butting the one end face of the work against the protrusion of the lower frame plate and aligning the locating marks of the work with the collimated light which irradiates the predetermined position of the lower frame plate. When the mask film is mounted on the work by aligning the locating marks of the mask film with the location that the collimated light irradiates, the prealignment is made possible.

(7) The reflector for reflecting the light from the lamp of the light source device in the predetermined direction, the flyeye lens for adjusting the illuminance and others are placed in the light source device provided adjacent to the exposing stage, so that the humidity and the heat from the lamp are properly removed.

Further, the light source device is provided in the light source housing adjacent to the exposing stage, and the center of the light source device is located at the position deviated left or right from the center of the width of the exposing apparatus. Further, the first reflector reflects the light from the light source device at the predetermined angle which is parallel to one side of the work W and closer to the work W than a plane perpendicular to the optical axis of light perpendicularly emitted from the light source device. Therefore, the suitable distance for the radiation of vertical collimated light to the work is maintained.

(8) According to the method of aligning the work, the lower frame plate is separated apart from the movable table as the alignment table is lifted up and the lower frame plate is mounted on the alignment table when the movable table for transferring the lower frame plate along transferring paths provided horizontally at the top and the bottom is moved at its end.

Next, the work is mounted on the lower frame plate by bringing the end faces of the work into contact with protrusions provided along sides of the lower frame plate and the locating marks of the work are aligned with irradiation collimated beams.

Thereafter, a mask film is mounted on the work by aligning the locating marks of the mask film with the collimated beams for prealignment, and the alignment process is carried out by taking the locating marks of the work and the mask film by image-taking means, lowering the retaining mechanism towards the mask film to suck the mask film, lifting up the retaining mechanism to separate the mask film from the work, operating the alignment table in X-, Y- and θ-directions in accordance with the locations of the locating marks.

Next, the retaining mechanism is lowered to bring the mask film in contact with the work, and the work and the mask film are fixed and supported on the lower frame. The suction of the retaining mechanism is released and the retaining mechanism is lifted up. Then, the alignment process is completed.

(9) According to the method of exposing the work, the lower frame plate mounted on the movable table transferred in the exposing stage is separated apart from the movable table as the vertical transferring table is lifted up, and the lower frame plate is combined with the upper transparent frame plate placed above the lower plate. Next, the work is exposed with a predetermined pattern of the mask film by irradiating the work with light from the light source device. Thereafter, the lower frame plate is separated apart from the upper transparent frame plate and the lower frame plate is mounted on the movable table as the vertical transferring table is lowered.

(10) According to the method of transferring the work, one of the lower frames mounted on respective first and second movable tables is moved towards the alignment table in an alignment stage and the other lower frame is moved towards the vertical transferring table in the exposing stage by moving the first and second movable tables along transferring paths provided in two steps between the alignment stage and the exposing stage.

Next, in the exposing stage, the lower frame is separated and lifted up from the first movable table as the alignment table is lifted up, and the work is aligned with the mask film by operating the alignment table with the retaining mechanism for retaining the mask film. Then, the work and the mask film on the lower frame is fixed with fixing means. In the exposing stage, the lower frame plate holding the aligned work is separated and lifted up from the second movable table as the vertical transferring table is lifted up, and the lower frame plate is combined with the upper transparent frame plate provided above the lower frame to sandwich the work and the mask film. Then, the work and the mask film are vacuum-sucked.

In the alignment stage, the lower frame holding the aligned work and mask film is lowered as the alignment table is lowered, and the lower frame is mounted on the first movable table. In the exposing stage, the vacuum-suction of the vacuum frame is released. The lower frame holding the exposed work and mask film is lowered as the vertical transferring table is lowered and the lower frame is mounted on the second movable table.

Then, the first movable table is transferred from the alignment stage to the exposing stage along the transferring paths, and the second movable table is transferred from the exposing stage to the alignment stage.

BRIEF DESCRIPTION OF THE DRAWINGS

FIG. 9 is a cross-sectional view of a modified upper frame plate according to the present invention.

DETAILED DESCRIPTION OF THE PREFERRED EMBODIMENTS

The embodiments of the present invention will be described hereunder with reference to the accompanying drawings.

Figure 1:
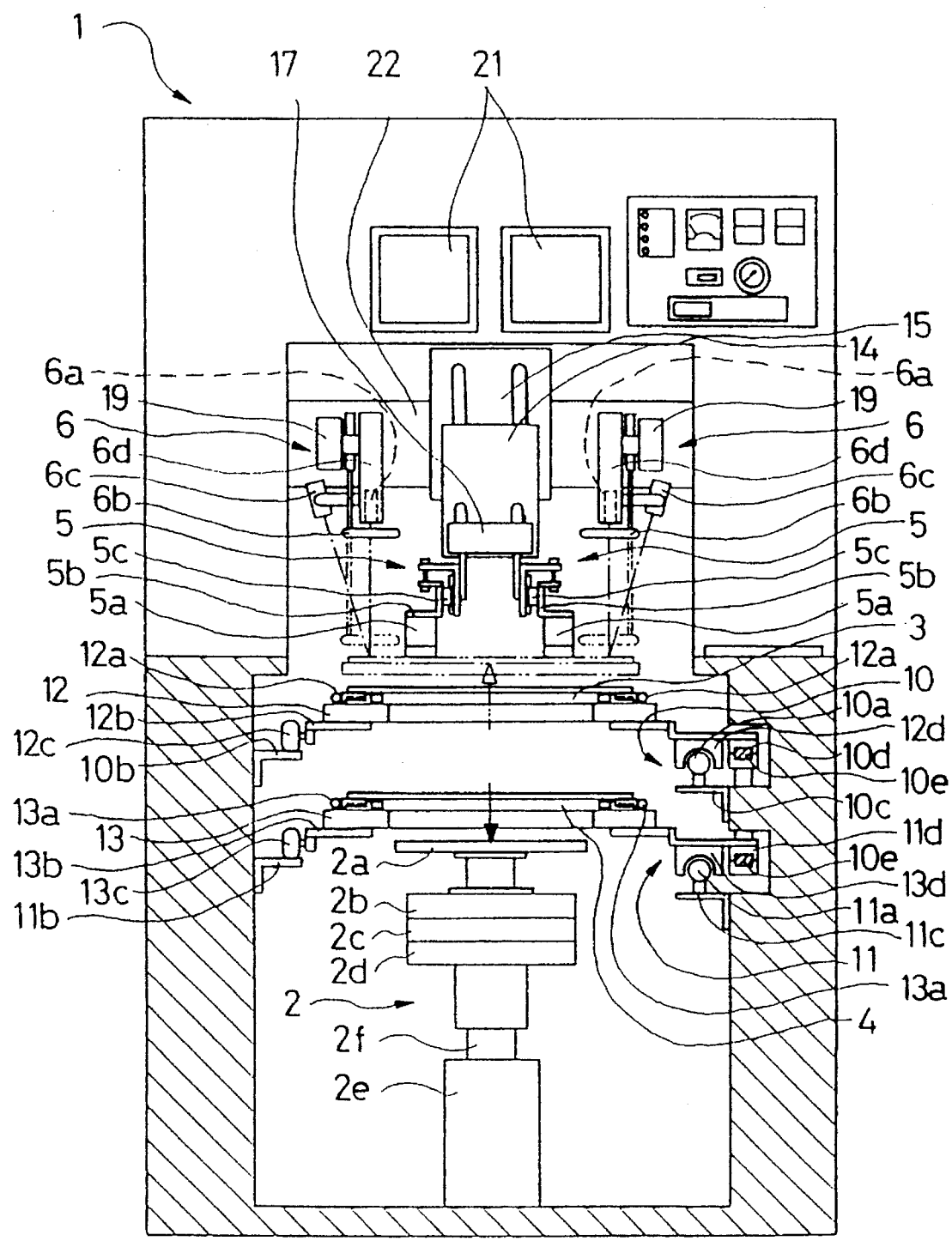
FIG. 1 is a front view showing the whole structure of an exposing apparatus with mask alignment system according to the present invention.
Figure 2:
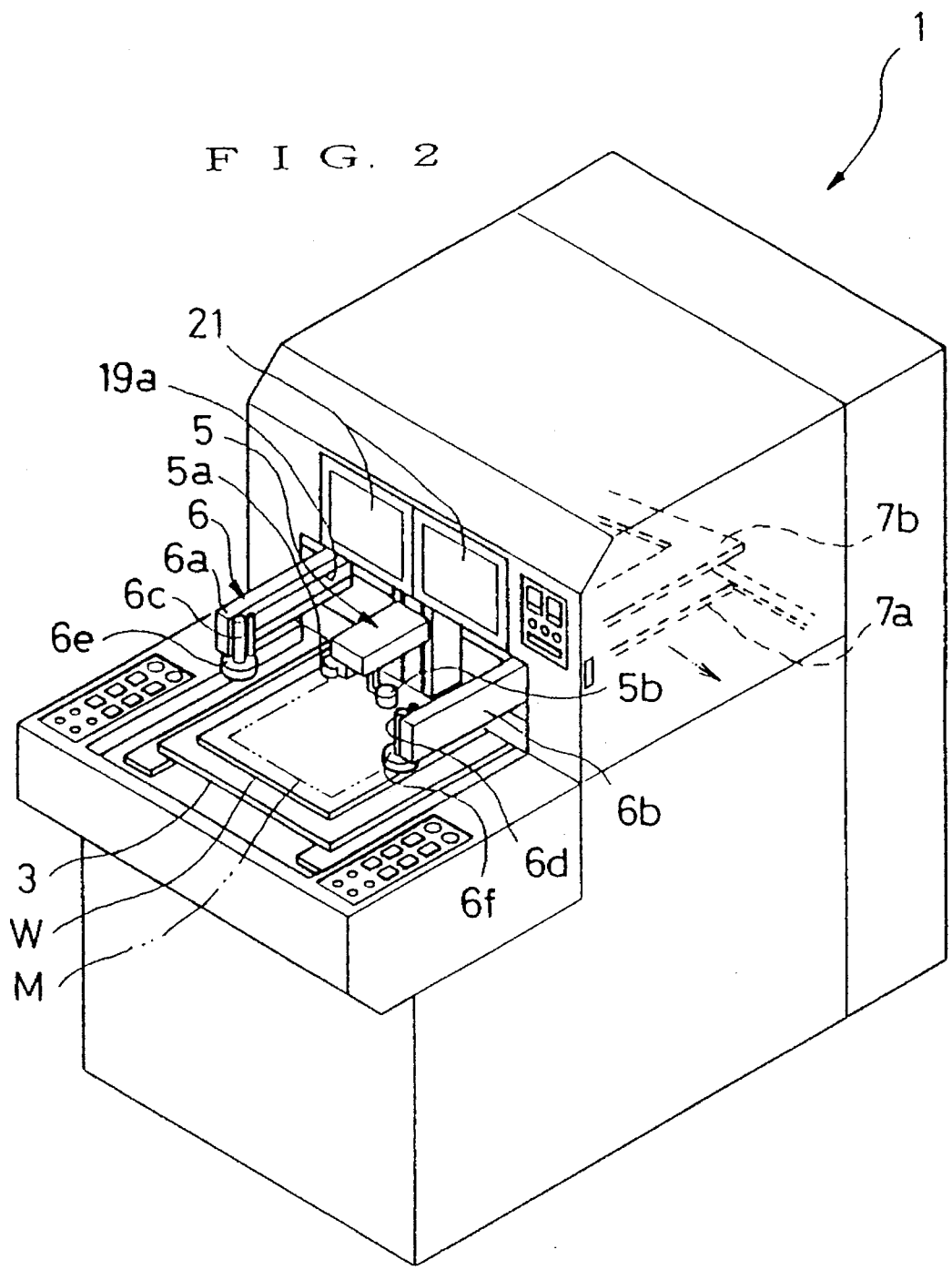
FIG. 2 is a perspective view of the exposing apparatus with mask alignment system according to the present invention.
Figure 3:
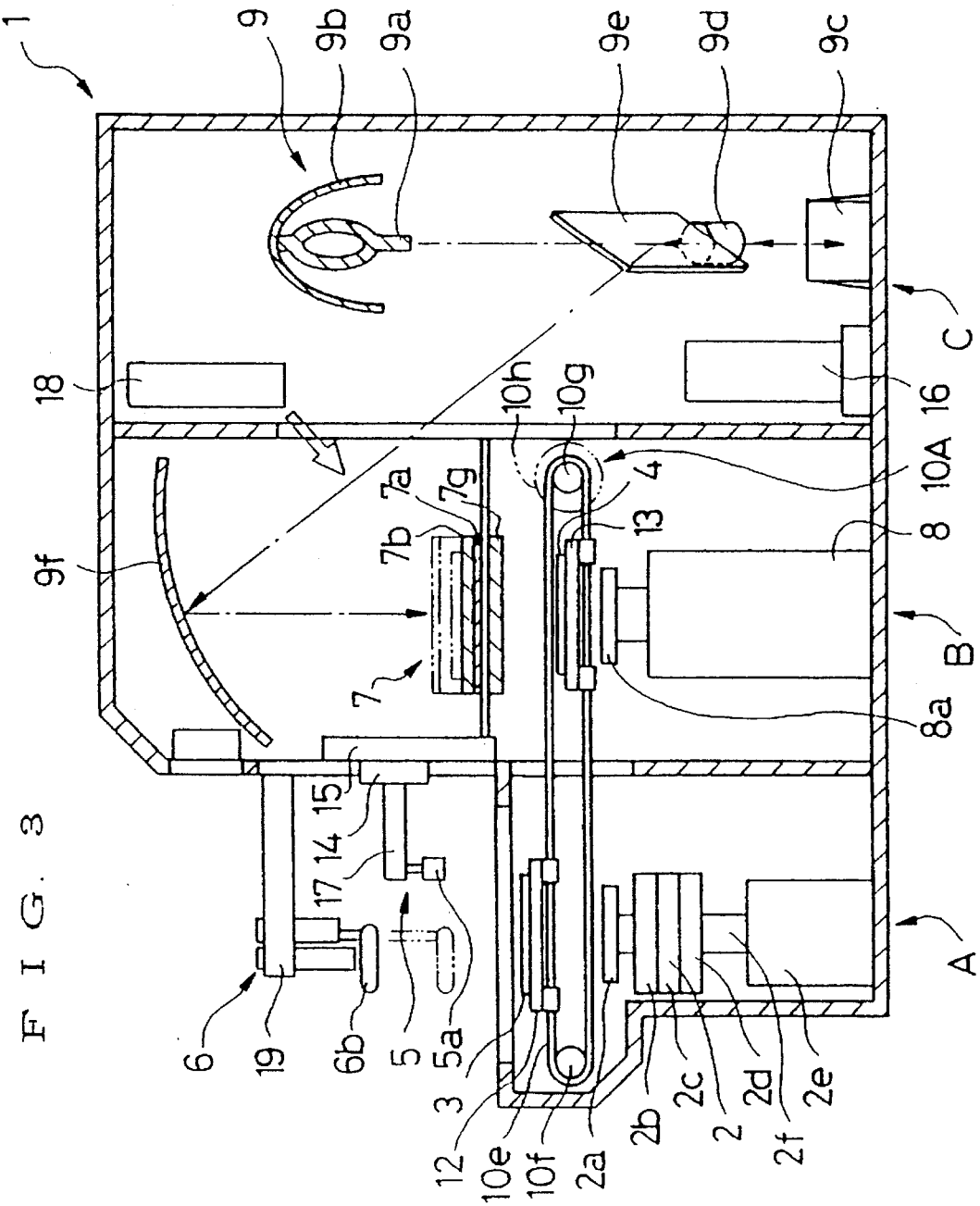
FIG. 3 is a principle explanation view showing the main part of the exposing apparatus with mask alignment system according to the present invention.

FIG. 1 is a front view showing a main part of an exposing apparatus. FIG. 2 is a perspective view of the exposing apparatus. FIG. 3 is a view showing a main part of the exposing apparatus.

The exposing apparatus 1 comprises an alignment stage A, an exposing stage B provided adjacent to the alignment stage A and a light source housing C provided adjacent to the exposing stage B, as shown in FIG. 3.

The alignment stage A comprises an alignment table 2 to be utilized in a work alignment process, a retaining mechanism 5 for retaining a mask film M, provided above the alignment table 2, an image-taking means 6 for taking images of locating marks of the work W and a mask film M, and others.

The exposing stage B comprises an upper transparent frame plate 7, a vertical transferring table 8 provided under the upper transparent frame plate 7, and a reflector 9f for reflecting light in a direction perpendicular to the work W, provided above the upper transparent frame plate 7.

The light source housing C comprises a light source 9, a cooling device 16, a rolling fan, a cooling radiator 18 and others.

Further, there are transferring mechanisms 10 and 11 for transferring movable tables 12 and 13 carrying the lower frame plates 3 and 4 between the alignment stage A and the exposing stage B.

As shown in FIG. 1, the alignment table 2 comprises a mounting table 2a for mounting the lower frame plates 3 and 4, an X-driving unit 2b for moving the moving table 2a in one horizontal direction, a Y-driving unit 2c for moving the X-driving unit 2b in a direction unit 2b for moving the moving table 2a in one horizontal direction, a Y-driving unit 2c for moving the X-driving unit 2b in a direction perpendicular to the driving direction of the X-driving unit 2b, a θ-driving unit 2d for rotating the Y-driving unit 2c around a vertical axis thereof, and a cylinder shaft 2f and a cylinder driving device 2e both for moving the mounting table 2a up and down.

When the cylinder driving device 2e drives the cylinder shaft 2f in an elongated direction, the mounting table 2a is lifted up to dispose the lower frame plate 3 or 4 which will be described later, from the respective movable table 12 or 13 and to mount the lower frame plate 3 or 4 on the mounting table 2a.

In a case of mounting the work W on the lower frame plate 3 or 4, the mounting table 2a of the alignment table 2 is lifted up to raise the lower frame plate 3 or 4 to the location shown by the imaginary lines. Further, the mounting table 2a is also raised to that location in a case of aligning the work W with the mask film M.

As shown in FIG. 1, the image-taking means 6 comprises cameras 6a at one ends of movable arms 19 with supporting units 6d. The supporting unit 6d is slidable along a slide groove 19a formed in a longitudinal direction of the movable arm 19. Further, provided at a predetermined position of the supporting unit 6d is an annular lamp 6b as a lighting device, which is placed so as to be movable up and down and which surrounds the camera 6a. Further, provided at a predetermined position of the supporting unit 6d at a predetermined angle is a lighting device 6c. The movable arm 19 is movable left and right along the slide mechanism 22 at which the proximal end of the movable arm is placed.

Figure 5:
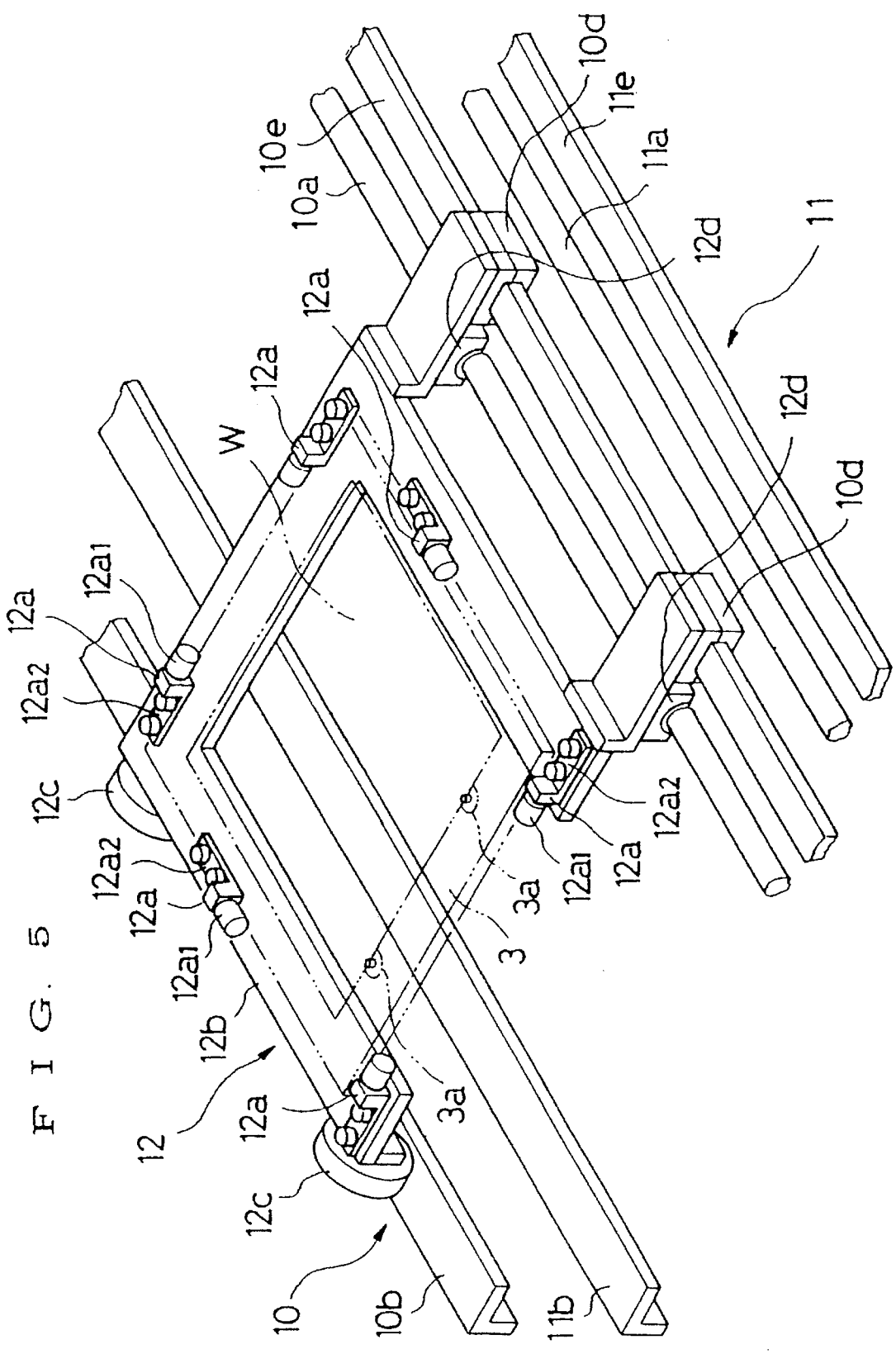
FIG. 5 is a perspective view of a movable table according to the present invention.

As shown in FIG. 1, the lightening device 6c is set in such a manner that when the work W on the lower frame plate 3 or 4 is disposed at the certain position as the alignment table 2 is lifted up, the lighting device 6c pinpoints positions of locating marks of the work W, with the collimated beams. Further, as shown in FIG. 5, the lower frame plate 3 or 4 comprises protrusions 3a or 4a near sides thereof, for butting against end faces of the work W.

The annular lamp 6b is lowered near the mask film M so that the locating marks are located within the lamp 6b. Then, the lamp 6b illuminates the work W with yellow light in order to create the best circumstance for the camera 6a when the locating marks of the work W are taken.

It should be noted that since the focal point of the camera 6a is moved by moving the movable arm 19 and the supporting unit 6d, the camera 6a is suitable for any size of the works W.

Figure 4:
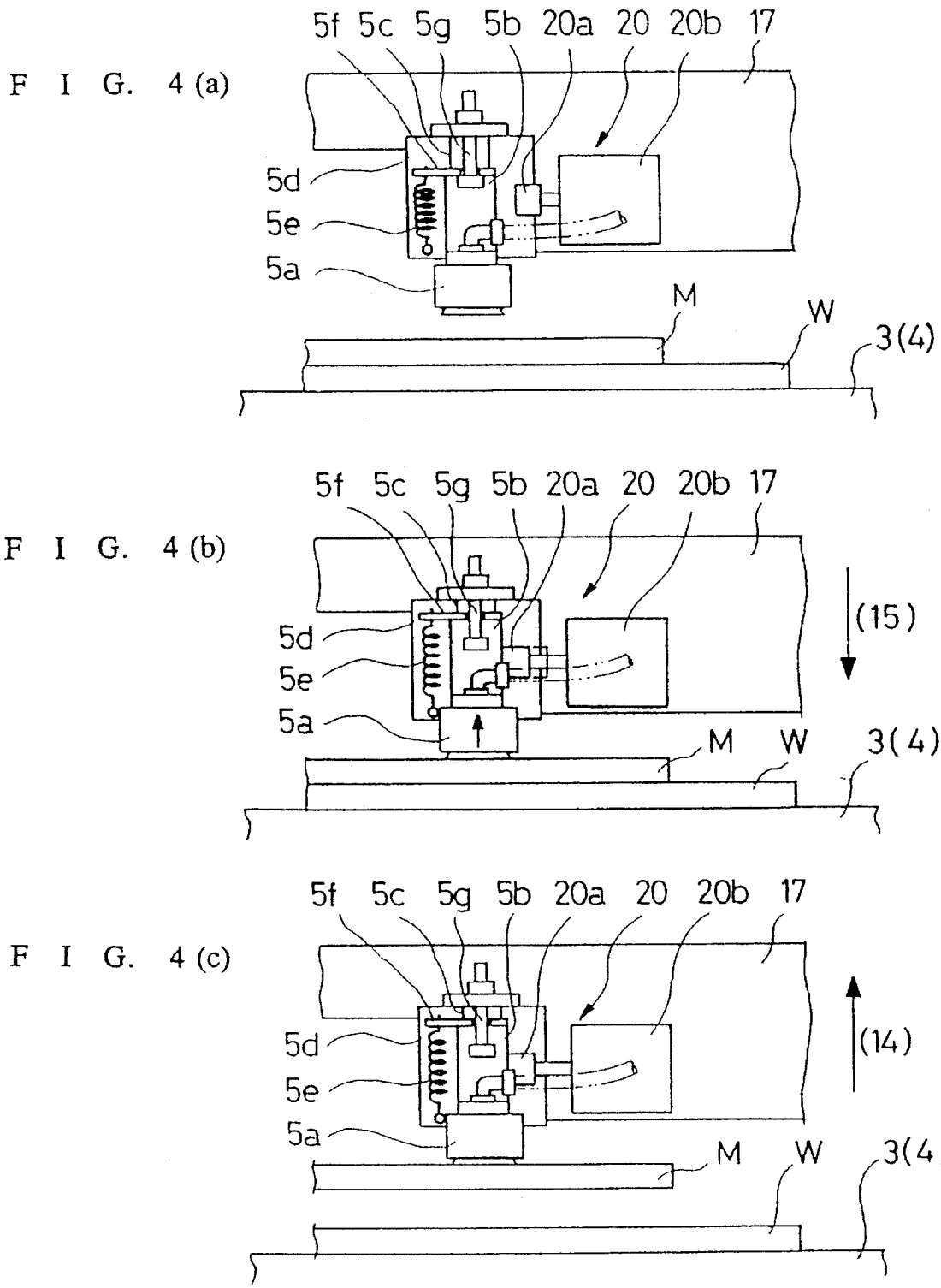
FIG. 4(a), (b) and (c) are side views of a suction unit of a retaining mechanism according to the present invention.

As shown in FIG. 1 and FIG. 4, the retaining mechanism 5 for retaining the mask film comprises a retaining piece 5b so as to be slidable on the slide unit 5c of the fixing unit 5d placed at the supporting arm 17, and a suction unit 5a for vacuum-sucking the mask film M, located under the retaining piece 5b. As shown in FIG. 4, the retaining piece 5b has a supporting piece 5f which horizontally projects. Provided under the fixing unit 5d is a spring 5e for pressing the suction unit 5a towards the mask film M.

As shown in FIG. 4, there is a protruding piece which projects horizontally at the top of the fixing unit 5d and the protruding piece is fixed by a bolt 5g with a nut. The bolt 5g is fitted into a hole formed at a predetermined position of the supporting piece 5f so that the head of the bolt 5g is in contact with the bottom surface of the supporting piece 5f.

The bolt 5g is for setting the lower end of the suction unit 5a at a predetermined position since the suction unit 5a is always pressed towards the mask film M.

Further, as shown in FIG. 4, there is a stopper-supporting unit 20 is fixed at the supporting arm 17 at the rear of the supporting piece 5b provided with the suction unit 5a. The stopper-supporting unit 20 comprises a retractable stopper arm 20a, and a stopper arm-driving unit 20b for driving the stopper arm 20a.

As shown in FIG. 1, the supporting arm 17 is supported at a first driving device 14 by a cylinder mechanism so as to be movable vertically, and the first driving device 14 is supported at a second driving device 15 so as to be movable vertically. The second driving device 15 moves the first driving device 14 up and down, and when the first driving device 14 is moved at its lowest position, the suction-unit 5a of the supporting arm 17 is in contact with the mask film M. Further, the first driving device 14 moves the supporting arm 17 up and down at a small stroke after the suction unit 5a of the supporting arm 17 sucks the mask film M by operating the second driving device.

As shown in FIG. 1 and FIG. 5, the transferring mechanisms 10 and 11 comprise linear guides 10a and 11a and flat guides 10b and 11b both provided as transferring paths between the alignment stage A and the exposing stage B, and an operating device 10A for operating the first movable table 12 and the second movable table 13 moving along the linear guides 10a and 11a and the flat guides 10b and 11b.

The operating device 10A comprises pulleys 10f and log provided in the alignment stage and the exposing stage, a timing belt 10e put on the pulleys 10f and log and a driving motor 10h provided at the pulley log (in drawings, in the exposing stage B).

The movable table 12 (13), as shown in FIG. 5, comprises a substantially U-shaped mounting table 12b (13b), wheels 12c (13c) provided at one end thereof, slide-holding units 12d (13d) placed at the opposite side of the wheels 12c (13c), and positioning rollers 2a (13a) placed on the upper surface of the mounting table. The location of the positioning rollers 12 corresponds to the upper transparent frame plate 7 provided in the exposing stage B. Each lower frame plate 12 or 13 mounted on the positioning rollers 12a (3a) is properly in contact with the upper transparent frame plate 7 (at a proper position) so that a vacuum frame is formed.

As shown in FIG. 5, the wheels 12c (13c) of the movable table 12 (13) move on the flat guide 10b (11b) and the slide holding units 12d (13d) slide along the linear guide 10a (11a). The positioning rollers 12a (13a) are fixed with fixing members $12a_2$ ($13a_2$) so that the sides of the lower frame plate 3 (4) are in contact with the rollers 12a. The fixing member $12a_2$ ($13a_2$) is provided with a rotatable roller $12a_1$ ($13a_1$). The sides of the lower frame plates 3 (4) are supported at the position surrounded by the inner sides of the rotative rollers $12a_1$ ($13a_1$).

As shown in FIG. 3 and FIG. 5, the first and second movable tables 12 and 13 have hook members 10d and (lid) hooked on the predetermined position of the timing belt 10e.

Accordingly, the lower frame plate 3 (4) supported by the positioning rollers 12a (13a) of the movable table 12 (13) is guided with the positioning rollers 12a (13a) to be mounted on and removed from the mounting table 2a. The lower frame plate 3 (4) is proceeded to the alignment process and the exposing process as separated apart from the movable table 12 (13) when the mounting table 2a of the alignment table 2 or a lifting table 8a of the vertical transferring table 8 which will be described later is lifted up. After these processes, the lower frame plate 3 (4) is guided with the positioning rollers 12a (13a) to be mounted on the mounting plate 12b (13b) when the mounting table 2a and the lifting table 8a are lowered.

As shown in FIG. 3, when the timing belt 10e is driven, the movable table 12 in the alignment stage A and the movable table 13 in the exposing stage B are alternately moved between the alignment stage A and the exposing stage B while holding the work W and the mask film M.

Next, the structure of the exposing stage B will be described.

Figure 6:
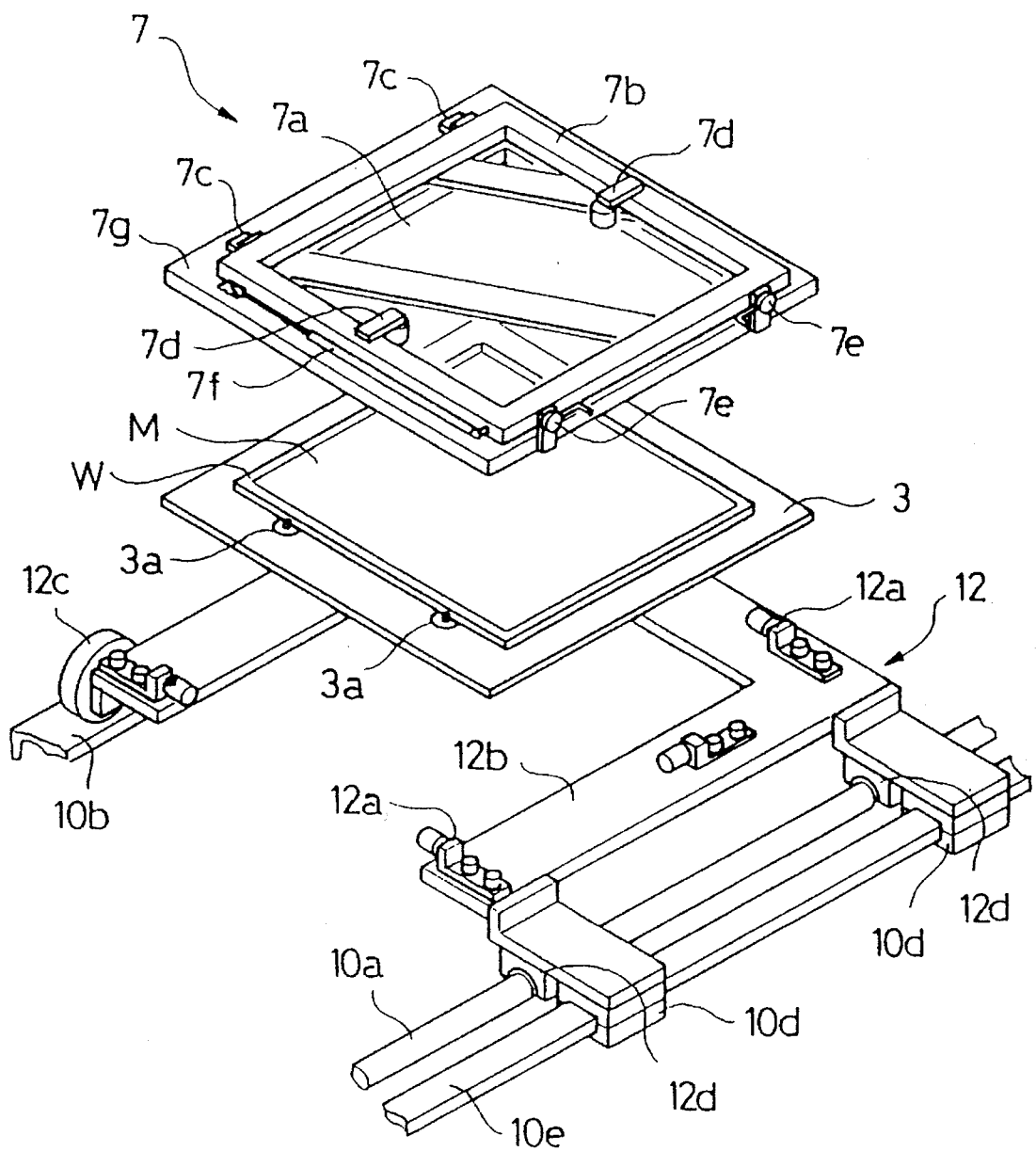
FIG. 6 is a perspective view of a main part of an upper transparent frame plate according to the present invention.

As shown in FIG. 3, the upper transparent frame 7 which forms a vacuum frame with the lower frame plate 3 or 4 is fixed in the exposing stage B. In the upper transparent frame plate 7, upper and lower frames 7b and 7g hold a transparent plate 7a. In other words, as shown in FIG. 6, the one side of the upper frame 7b is connected to the lower frame 7g with hinges 7c. Provided at the opposite side of the hinges 7c is hook handlers 7e and provided at the remaining sides is cylinders 7f.

Therefore, when the hook handlers 7e are unlocked, the upper frame 7b is lifted up by the cylinders 7f. There are two through holes at predetermined positions of the transparent plate 7a. Suction pads 7d provided at the upper frame 7b are in contact with the through holes. When the lower frame plate 3 (4) which will be described later is lifted up, the lower frame 3 (4) together with the work W and the mask film M is sucked and held by the suction pads 7d. Note that provided at the periphery of the lower surface of the transparent plate 7a is a sealing rubber 7h (see FIG. 7). Further, as shown in FIG. 2, the transparent plate 7a slides as shown by the arrow and is readily removed when the upper frame 7b is lifted up.

Figure 9:
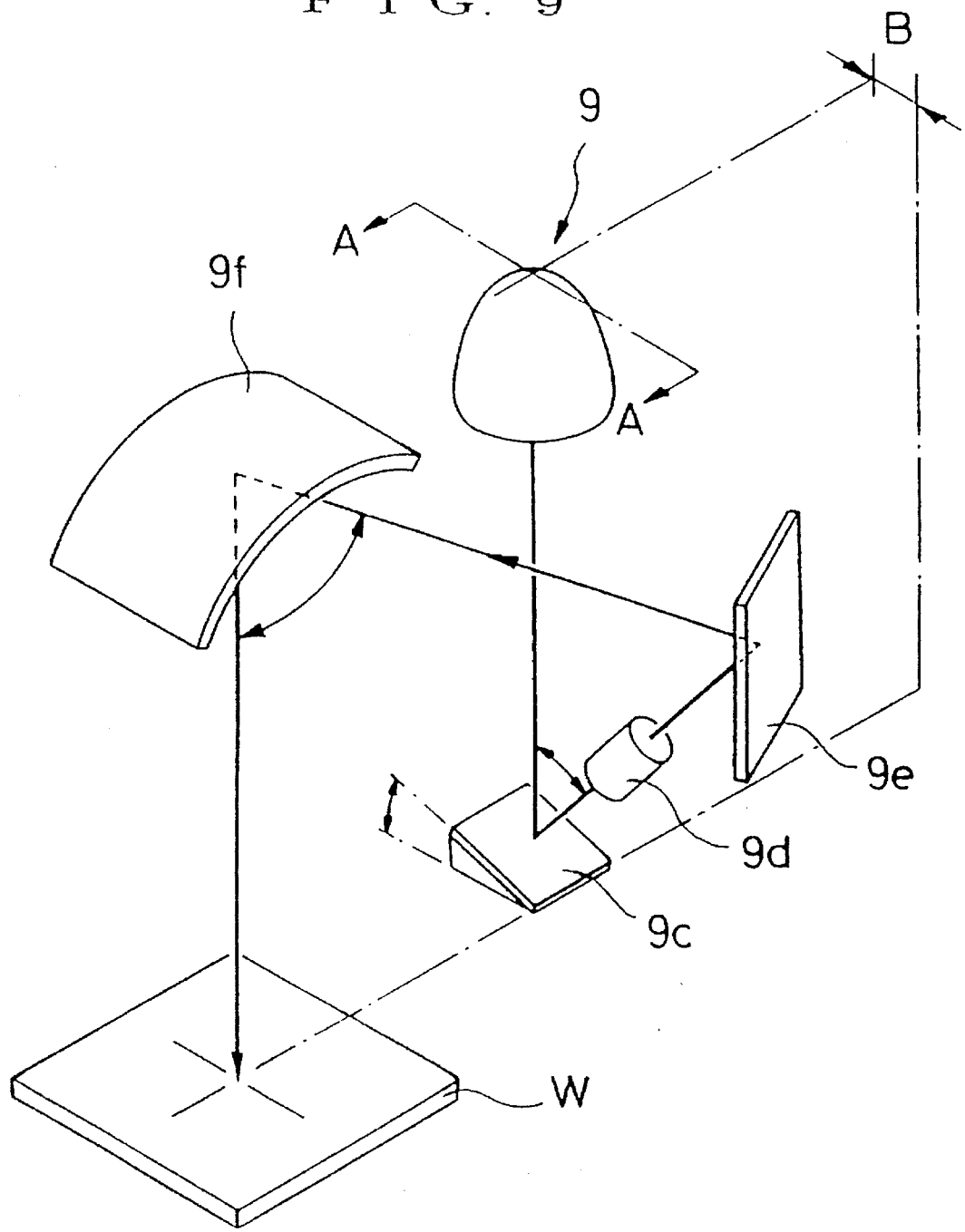
FIG. 9 is a perspective view of a light source according to the present invention.

As shown in FIG. 9, the light source device 9 placed in the light source housing C comprises a lamp 9a, an elliptic reflector 9b for collecting and reflecting illumination light from the lamp 9a, a first reflector 9c for reflecting the illumination light from the lamp 9a at a predetermined angle, a flyeye lens 9d for adjusting illuminance of the reflected light from the first reflector 9c, and a second reflector 9e for reflecting the illumination light from the flyeye lens 9d to a curved-reflector 9f in the exposing stage B.

The center of the light source device 9 is, as shown in FIG. 9, located at the position deviated left or right from the center of the width of the exposing apparatus by a predetermined distance B (in FIG. 9, left as seen from the work W). Further, the direction of the optical axis of the light reflected by the first reflector is parallel to one side of the work W to be transferred (in FIG. 9, one side of the work W, perpendicular to the transferring direction of the work W), and located closer to the work W than a plane perpendicular to the optical axis of light perpendicularly emitted from the light source device (shown as the center lines A—A in FIG. 9).

As the first reflector is tilted at 25 degrees, the optical axis of light reflected by the first reflector is set at 50 degrees and the angle between the vertical collimated light and the optical axis of light incident on the curved-reflector 9f from the second reflector 9e is 50 degrees. Therefore, the arrangement of the vertical collimated light which is reflected by the curved-reflector 9f and which is incident on the work W is made easier.

The light source housing C comprises a cooling device 16, a rolling fan, a radiator and others. FIG. 1B shows the configuration of the cooling device except for the part surrounded by the dotted lines. Coolant is supplied from a supplier to the cooling device 16. The coolant is divided into two, for cooling the cooling device 16 itself and for cooling the refrigerant of the radiator 18. The coolant is exhausted after used. Therefore, as shown in FIG. 3, cool wind is blown from the rolling fan and the radiator 18 towards the work.

The exposing apparatus operates in the following manners.

As shown in FIG. 3, the first and second movable tables 12 and 1B are arranged in the alignment stage A and the exposing stage B, respectively. First, the alignment table lifts up the mounting table 2a and the lower frame plate 3 is separated apart from the first movable table 12 and mounted on the mounting table 2a.

Next, the work W is mounted on the lower frame 3 by bringing the end faces of the work in contact with the protrusion 3a so that the locating marks of the work W are matched with one of the locations where the collimated light irradiates.

Thereafter, the mask film M is mounted on the work W while the locating marks of the mask film M are matched with the locations where the collimated light pinpoints. Mounting the work W and the mask film M on the lower frame plate B (2) makes prealignment process possible. The prealignment process is effective in carrying out the alignment process smoothly.

Next, as shown in FIG. 1, the lamps 6b are lowered, and the locating marks of the work W and the mask film M are taken by the cameras 6a to calculate the amount of the positional deviation. Concurrently, the retaining mechanism 5 is operated to separate the mask film apart from the work W. In other words, as shown in FIG. 1 and FIG. 4 (a) and (b), the second driving device 15 is operated to be moved down to lower the first driving device 14 and the supporting arm 17. As shown in FIG. 4(b), the suction units 5a descended together with the supporting arm 17 are brought into contact with the mask film M. In this circumstance, even if the second driving device 15 is descended lower and the suction unit 5a exceeds the location where the suction unit 5a meets the mask film M, the retaining piece 5b slides up along the slide unit 5c against the resilience of the spring 5e, so that the suction unit 5a is moved to the proper position. Then, when the suction unit 5a is moved to the proper location, the stopper arm of the stopper supporting unit presses and supports the sides of the retaining piece 5b to fix the position of the suction unit 5a.

Further, the suction unit 5a in contact with the mask film M performs the vacuum suction, which vacuum-sucks the mask film M. As shown in FIG. 1 and FIG. 4(c), the first driving device 14 supporting the supporting arm 17 is operated to lift up the supporting arm 17 with a small stroke. In this case, the work W and the mask film M can be in contact at some part if the work W is separated apart from the mask film M so that the exposing pattern of the mask film M does not deteriorate even with the positional deviation due to the slide.

In the image-taking means 6, an arithmetic processing unit processes the information of the positions of each locating mark taken by the cameras 6a and calculates the amount of positional deviation. After the mask film is separated apart from the work, X-, Y-, θ-driving units 2b, 2c and 2d are operated to carry out the alignment process of the work W and the mask film M. The status of the alignment process is displayed on a monitor 21 shown in FIG. 1. After the alignment process is completed, the first driving device 14 moves the supporting arm 17 down and the mask film M sucked by the suction unit 5a is mounted on the work W.

With this conditions, the work W and the mask film M are fixed on the lower frame plate 3 by the fixing means such as adhered tapes. Further, the vacuum suction of the suction unit 5a is released and concurrently the supporting arm 17 is lifted up by the second driving device 15.

Next, as the alignment table 2 is lowered 3, the mounting table 2 is also lowered and guided to be mounted on the movable table 13 with the positioning rollers 3a of the movable table 12.

The work W after the alignment process is transferred to the exposing stage B as the first movable table 12 is moved along the linear guide 10a and the flat guide 11b by running the timing belt 10e of the operating device 10A. Concurrently, with the transfer of the first movable table 12, the second movable table 1B located in the exposing stage B is transferred to the alignment stage A along the linear guide 11a and the flat guide 11b.

Figure 7:
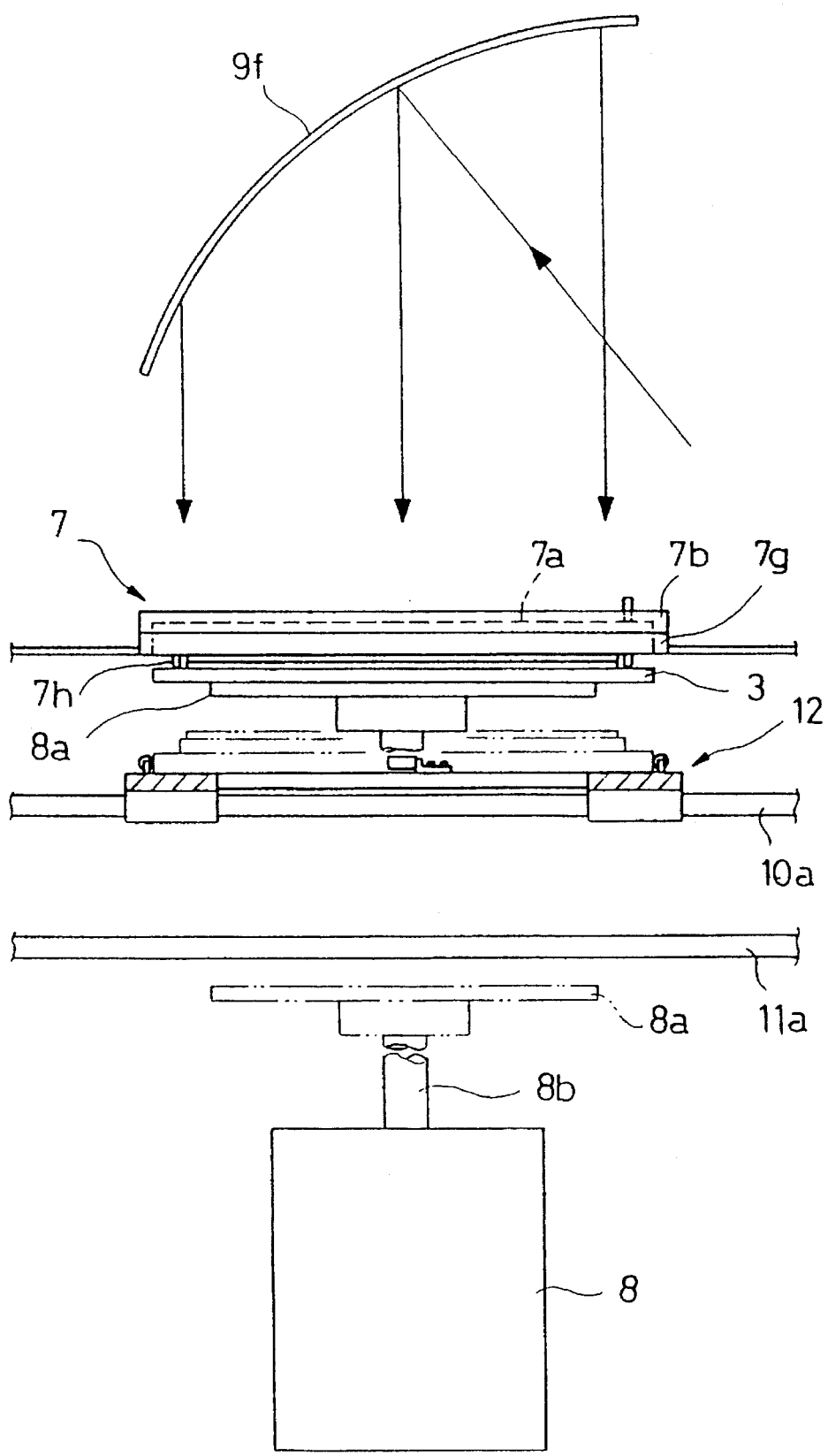
FIG. 7 is a side view of a main part of an exposing stage according to the present invention.
Figure 8:
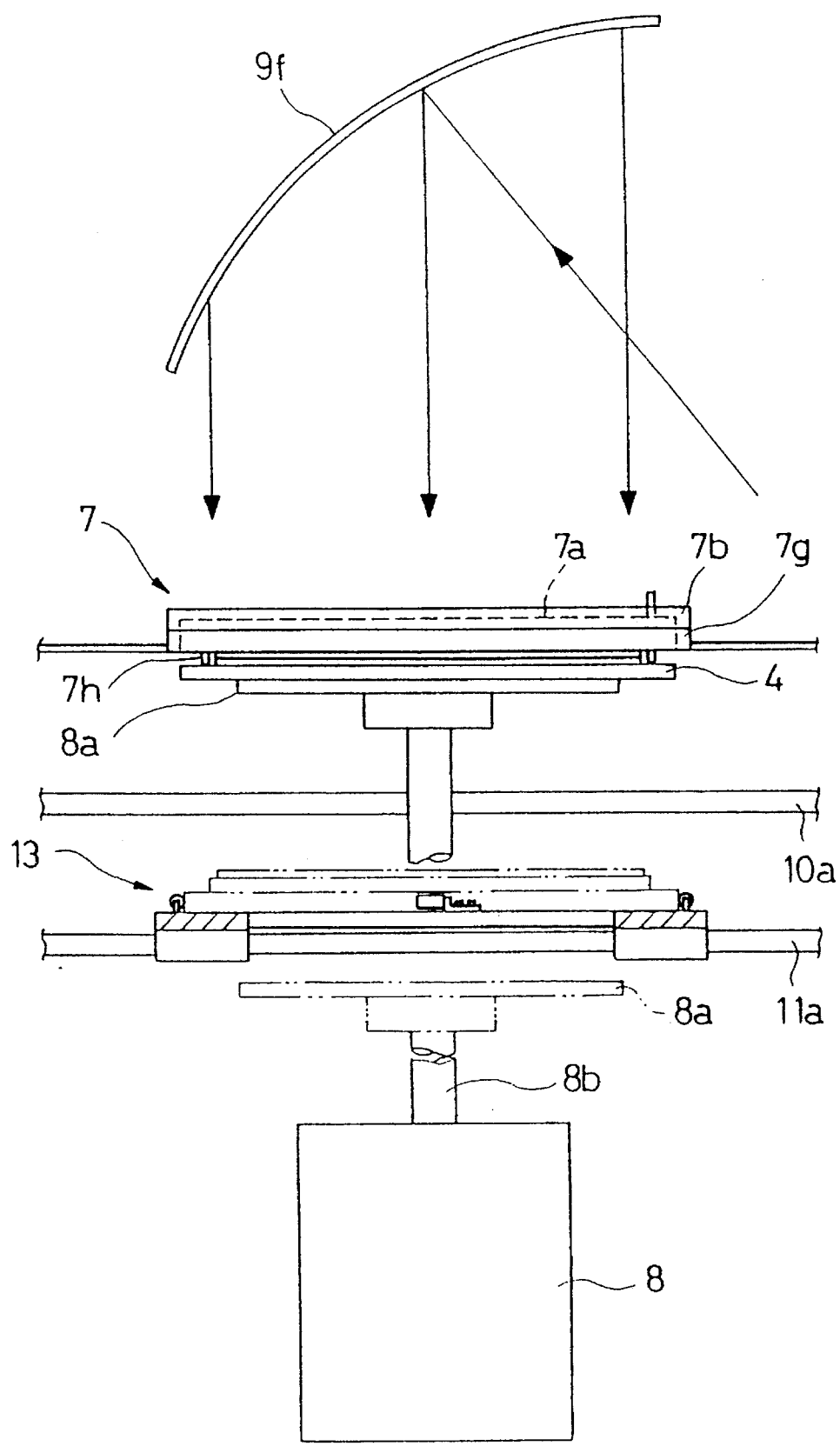
FIG. 8 is a side view of a main part of the exposing stage according to the present invention.

As shown in FIG. 7, under the first movable table transferred to the exposing stage, the lifting table 8a of the vertical transfer table 8 is lifted up and the lower frame plate B on the first transfer table 12 is lifted up to be separated apart from the first transfer table 12 (from the imaginary lines to the solid lines) and brought into contact with the transparent plate 7a of the upper transparent frame plate 7. Next, with this condition, the lower frame plate is sucked from the side of the suction pads 7d of the upper transparent frame plate, and then the space surrounded by the transparent plate 7a, the sealed rubber 7h, and the lower frame plate 3 is vacuumed, and the upper and lower frame plates 3 and 7 are combined to form a vacuum frame. At this point, the work W and the mask film M are not deviated because they are fixed and supported on the lower frame plate.

Thereafter, light is emitted from the light source device 9 and the light arrived at the curved-reflector 9f is changed to be collimated light to irradiate the work W over the mask film M. The work to be exposed is irradiated for a predetermined length depending upon the types of works such as solder resist, etching resist. When the exposure of the work is completed, the vacuum suction of the upper transparent frame plate 7 is released and the lower frame plate 3 is released from the upper transparent frame plate 7. Then, the lower frame plate 3 is lowered as the lifting table 8a is lowered, and the lower frame plate 3 is guided to the movable table 12 by the rotative rollers 12a and supported thereon.

On the other hand, during the work exposing process, in the alignment stage A, the alignment process is carried out for another work W. Then, when the exposing process and the alignment process for each work are completed, the works W are mounted on the respective movable tables 12 and 13 and transferred between the stage A and the stage B by the transferring mechanisms 10 and 11. The lower frame plate 4 transferred by the second movable table 13 is separated apart from the movable table 13 as the lifting table 8a of the vertical transferring table 8 is lifted up, and the lower frame plate 4 is mounted on the lifting table 8a. The lower frame plate 4 is combined with the upper transparent frame 7 to form a vacuum frame. Then, the exposing process is carried out. As described above, the exposing process is performed by repeating the alignment process, the transferring process and the exposing process.

Figure 10:
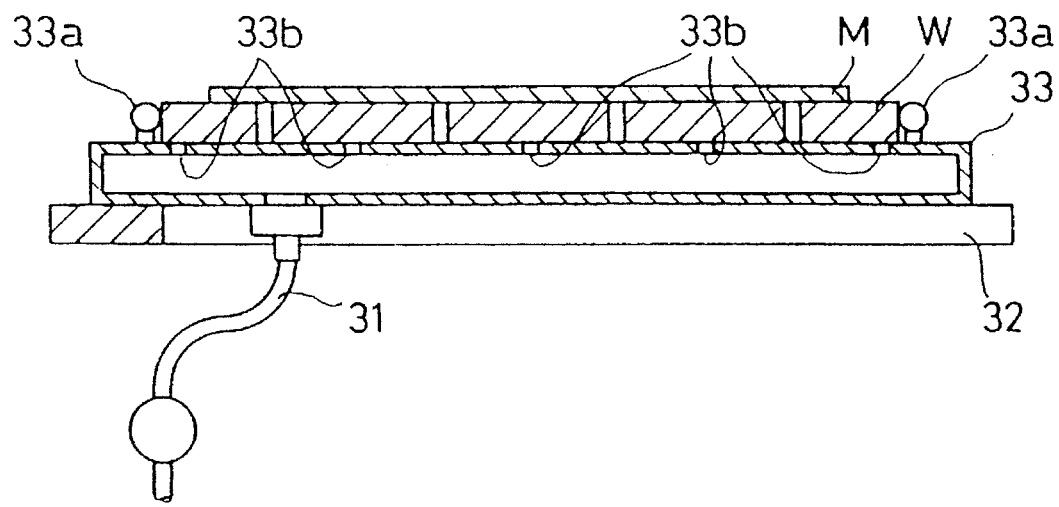
FIG. 10 is a plan view of a modified retaining mechanism according to the present invention.

It should be noted that the fixing means for fixing the work and the mask film can be replaced the lower frame plate 33 as shown in FIG. 10. That is, suction holes 33b are formed in the upper surface of the movable table 33, and the work W is sucked by the connecting hose which is provided under the lower frame plate 33 and supported on the lower frame plate 33. Note that almost all of works W have through holes formed therein, and the mask-film M can also be sucked through these through holes.

Figure 11:
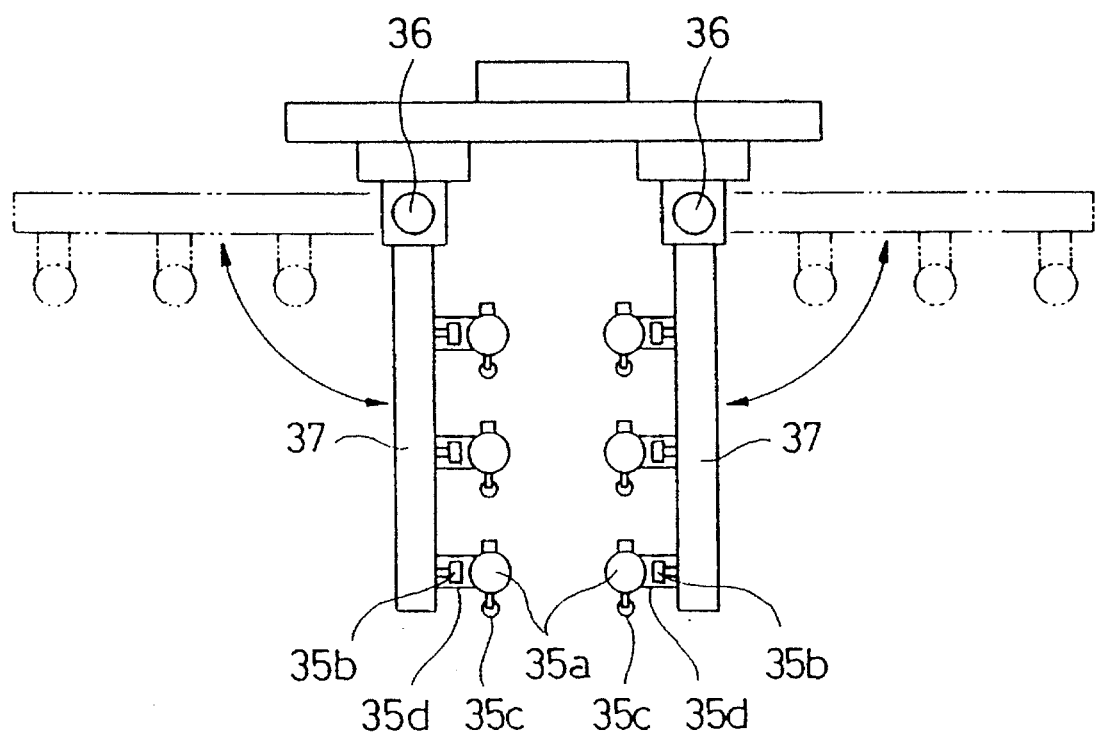
FIG. 11 is a cross-sectional view of a modified light source according to the present invention.

Further, in the above-described retaining mechanism, though the mask film M is not completely separated from the work W, the work can be transferred for the alignment without causing problems but if the mask M is needed to be completely separated apart from the work W, it is convenient to form the retaining mechanism with the configuration as shown in FIG. 11. That is, a plurality of suction units 35a (in FIG. 11, three for each side) are placed with the fixing unit 35 so as to be movable up and down, and the suction unit 35a is always pressed towards the mask film by the spring member 35c. Further, stopper arms 35d are provided at the corresponding suction units 35a, and the supporting arms 37 can be rotated around the rotating axis which is the proximal end thereof, as shown by arrows in FIG. 11.

Figure 12:
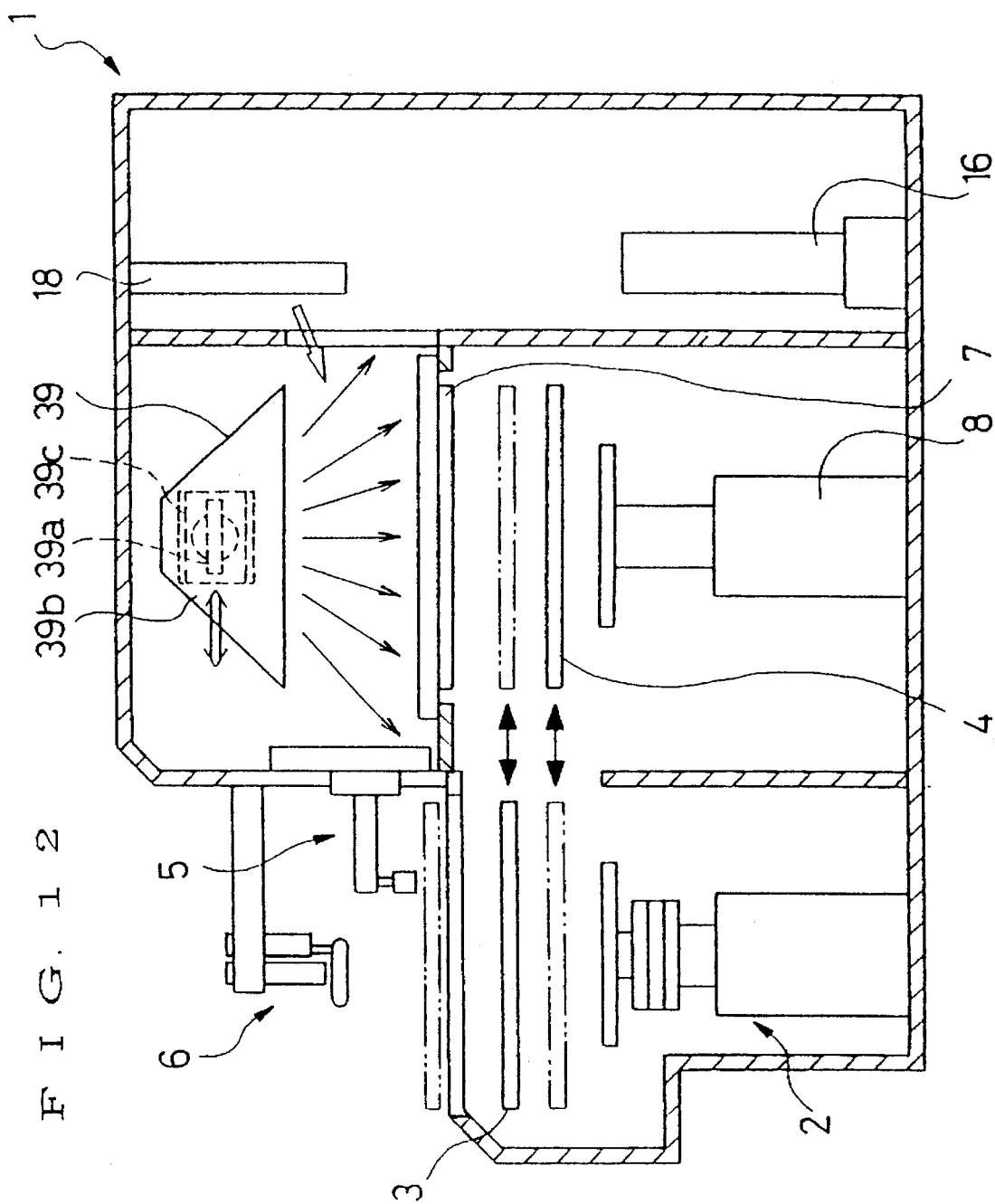
FIG. 12 is a block diagram of a circulated path of coolant of a cooling apparatus according to the present invention.

Furthermore, in the light source device, the lamp may directly irradiate the work. In this case, as shown in FIG. 12, the cooling housing is placed at the rear of the exposing stage, and the cooling device 16, the rolling fan, the cooling radiator 18 and others are installed in the cooling housing.

Figure 13:
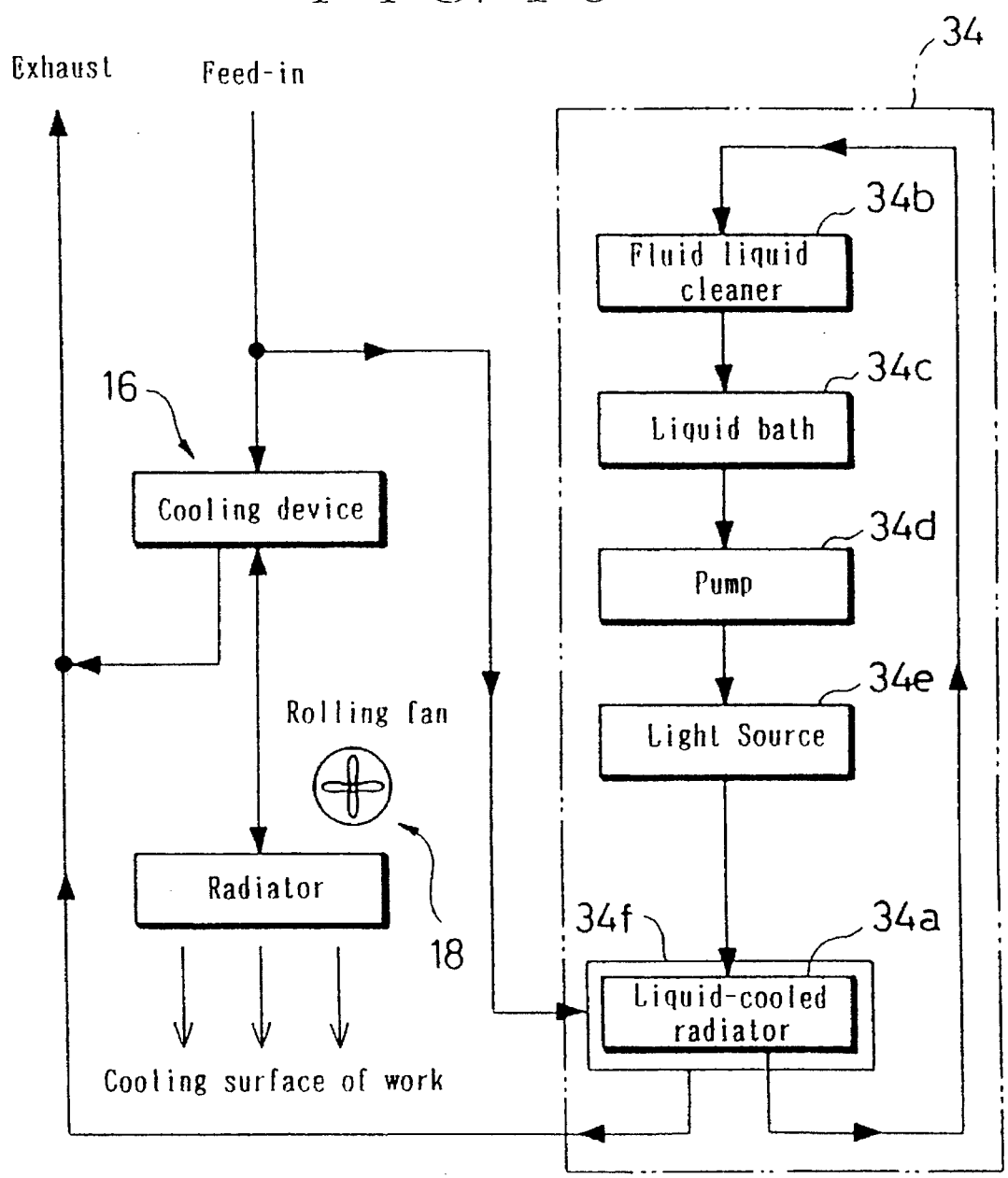
FIG. 13 is a perspective view showing the structure of the conventional exposing apparatus.
Figure 14:
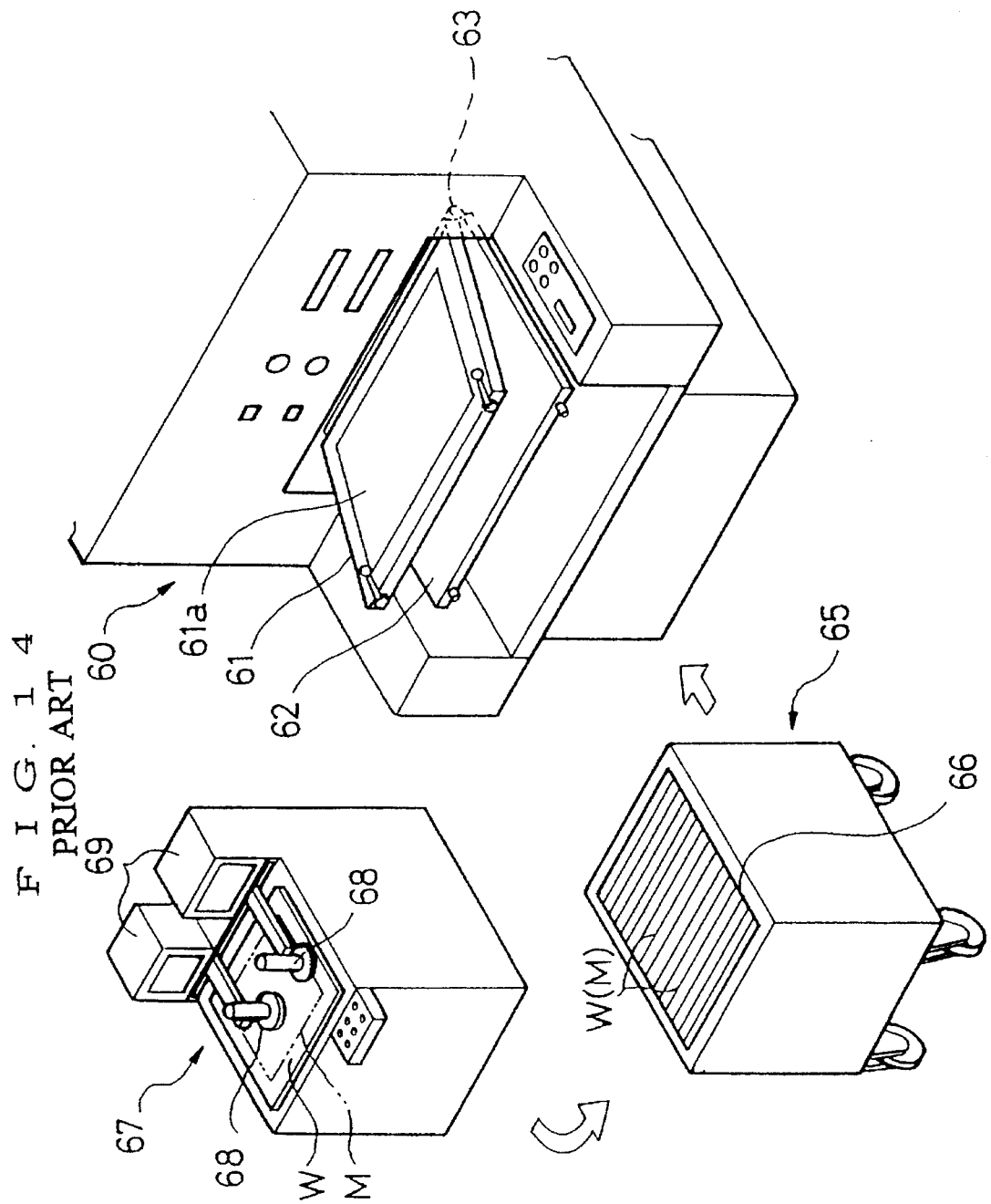
FIG. 14 is a cross-sectional view of the conventional exposing apparatus.
Figure 15:
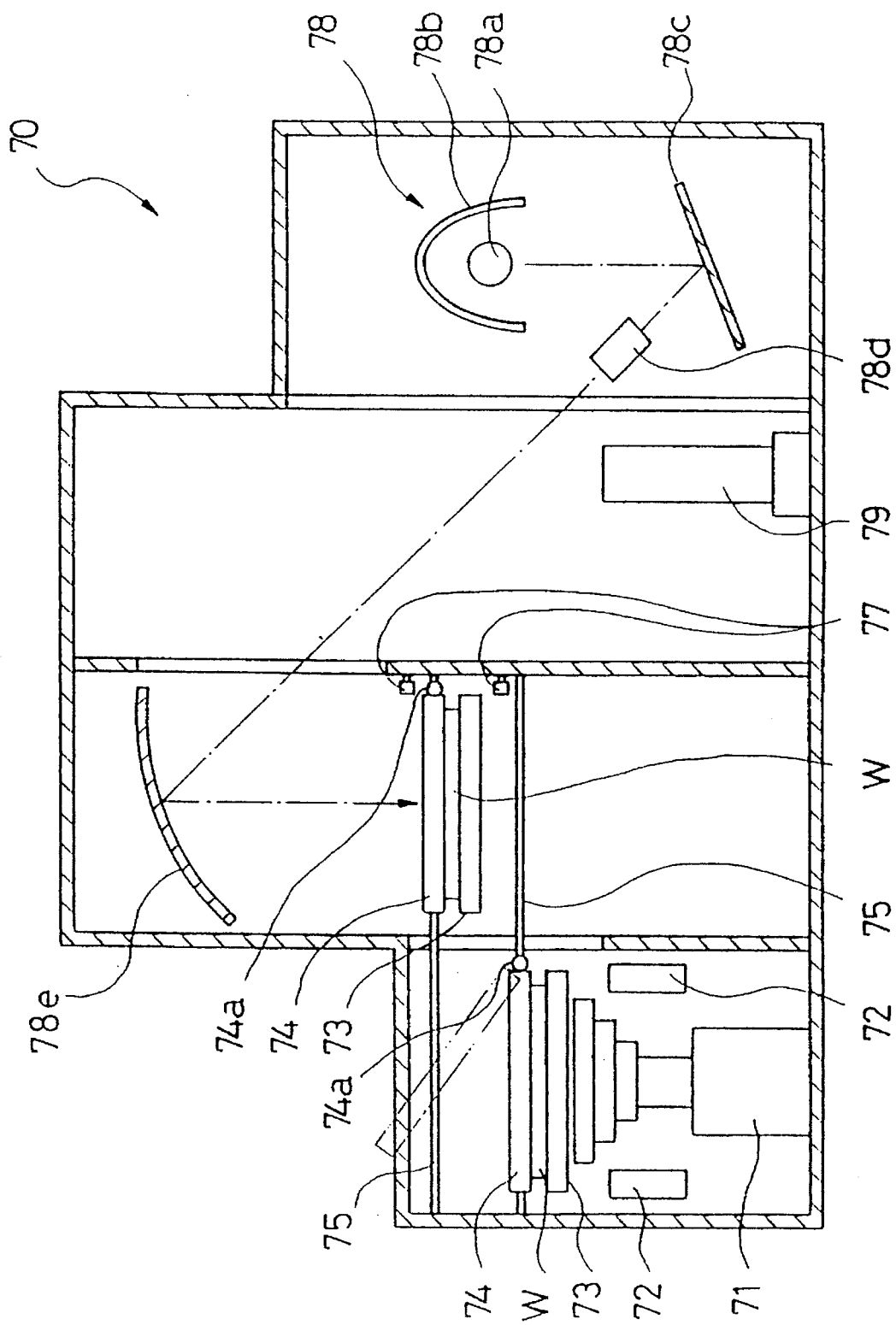
FIG. 15 is a cross-sectional view of the conventional exposing apparatus.

The means of cooling the lamp may be a liquid-cooled type for directly or indirectly cooling the lamp. In this case, as shown in FIG. 13, the cooling means 34 supplies the coolant to the lamp 34e through the liquid-cooled radiator 34a for the circulated coolant, the fluid liquid cleaner 34b for cleaning the coolant cooled by the liquid-cooled radiator 34a, the liquid tab 34c for storing the coolant after cleaned, and the pump 34d. The refrigerant of the radiator 34a is cooled by the refrigerant such as water supplied from the supplier in the cooling unit 34f provided along the liquid-cooled radiator 34a. Note that if it takes time to turn on the lamp, it is preferable to place a shutter 34c for shielding the light from the lamp.

Alternatively in the transfering device, the screw mechanisms are used in stead of the linear guide and the driving device, and a retaining unit moving with the screws, provided at one end of the movable table and the feed screws are rotated to transfer the movable table. In this case, the two feed screws are placed at the top and bottom between the alignment stage and the exposing stage, and one driving unit for rotating the feed screws in the opposite directions is placed to transfer the movable tables alternately between the exposing stage and the alignment stage.

Further, the guide provided at the movable table may be a fixed guide and the portion which is to be in contact with the side face of the lower frame plate may be curved, or tapered so that in the case that the lower frame plate is deviated from its proper position, it is guided by the tapered portion to be placed at the proper position. The rotating face of the rotative roller may be projected from the respective side face of the lower frame plate and the fixed guide for guiding the rotative roller of the lower frame plate may be provided on the movable table.

Further, the exposing apparatus may comprise two exposing devices adjacent to each other and one light source device provided at the center in the light source housing. In this case, the first reflector for reflecting the light from the light source device at a predetermined angle may be rotatable and the reflector is provided for reflecting the light to the reflector provided in the exposing stage, so that the works in both exposing stages may be alternately exposed. Furthermore, the exposing apparatus may comprise two exposing devices and one light source housing which are arranged in line, and the first reflector is rotated to change the direction of light, so that the works in both exposing stages are alternately exposed.

Thus, as described above, the present invention shows the following effects.

(1) In the retaining mechanism for retaining the mask film, the supporting arm is moved up and down by the first driving device and the second driving device with different strokes, and the suction unit for vacuum-sucking the mask film is fixed with the stopper supporting unit. Therefore, the process of aligning the work with the mask film is easy even the thickness of the works is different.

(2) The suction unit is formed to be pressed towards the mask film by the elastic member, so that the suction unit is accurately brought into contact with the mask film and sucks the mask film when the supporting arm is lowered by the first driving device.

(3) The movable tables which are alternately transferred horizontally along the upper and lower transferring paths have positioning guides at the predetermined position of the mounting plate. Then, the movable table supports the lower frame plate along the positioning guide. Accordingly, when the alignment table and the vertical transferring table placed in the alignment stage and the exposing stage to which the transferring tables are transferred are lifted up above the upper and lower transferring paths, the lower frame plates are separated apart from the respective movable plates and mounted on the alignment table and the vertical transferring table. When the alignment table and the vertical transferring table on which the lower frame plates are mounted are lowered, the lower frame plates are guided by the positioning guides to be mounted on the transferring tables. Therefore, the automatic alignment and the automatic exposure, of the work and the mask are made possible, which improves the processability of the work.

(4) The rotative rollers are utilized in the positioning guide for mounting and supporting the lower frame plate of the movable table. The lower frame plate is guided by the rotative rollers, so that the lower frame plate is mounted and supported on the movable plate and separated apart from the movable table, smoothly.

(5) In the image-taking means provided in the alignment stage, the supporting means of the camera is movable along the longitudinal direction of the movable arm above the mask film, and the proximal portion of the movable arm is movable to the horizontal groove. Accordingly, it is not required to form holes in the work, and the alignment process can be carried out for any sizes of the works.

Further, in the supporting means, the annular lightning device is provided so as to be movable up and down. If the locating marks of the work and the mask film are taken by the camera, the lightning device irradiates the locating marks at its lowest position, so that the locating marks are accurately taken by the camera.

(6) The work is mounted on the lower frame plate by butting the one end face of the work against the protrusion of the lower frame plate and aligning the locating marks of the work with the collimated light which irradiates the predetermined position of the lower frame plate. When the mask film is mounted on the work by aligning the locating marks of the mask film with the location where the collimated light pinpoints, the prealignment is made possible.

(7) The reflector for reflecting the light from the lamp of the light source device in the predetermined direction, the flyeye lens for adjusting the illuminance and others are placed in the light source device provided adjacent to the exposing stage, so that the humidity and the heat from the lamp are properly removed.

Further, the light source device is provided in the light source housing adjacent to the exposing stage, and the center of the light source device is located at the position deviated left or right from the center of the width of the exposing apparatus. Further, the first reflector reflects the light from the light source device at the predetermined angle which is parallel to one side of the work W and closer to the work W than a plane perpendicular to the optical axis of light perpendicularly emitted from the light source device. Therefore, the suitable distance for the radiation of vertical collimated light to the work is maintained, and the size of the exposing apparatus becomes small.

(8) The work and the mask film are aligned on the lower frame plate which is removable from the movable table in accordance with the above-described aligning method, so that the alignment process is completed smoothly.

(9) In accordance with the above-described work transferring method, the work and the mask film are never deviated from the position while transferred or while the lower frame plate is combined with the upper transparent frame, since the work and the mask film are fixed on the lower frame plate with the fixing means. Moreover, the alignment process, the exposing process and the transferring process are accurately carried out.

(10) In accordance with the work exposing method, the work and the mask film fixed on the lower frame plate are accurately exposed without the positional deviation.

What is claimed is:

1. An exposing apparatus with mask alignment system comprising an alignment stage for aligning a work with a mask film, an exposing stage for exposing the aligned work, a transferring mechanism for transferring the work between said alignment stage and said exposing stage, a light source device for irradiating the work with light in said exposing stage, and image-taking means for taking images of the work and the mask film from the top of the work and the mask film in said alignment stage, said exposing apparatus with mask alignment system comprising:

a retaining mechanism for retaining the mask film from the top of the mask film, provided in said alignment stage;

said retaining mechanism further comprising:
 a suction unit for sucking the mask film;
 a supporting arm for supporting said suction unit so as to be movable up and down;
 a first driving device for moving said supporting arm up and down;
 a second driving device for moving said first driving device up and down; and
 a stopper supporting unit for fixing and supporting said suction unit when said suction unit is moved to a predetermined position.

2. An exposing apparatus with mask alignment system according to claim 1, wherein said supporting arm comprises a guide unit for sliding said suction unit up and down; and ends of an elastic material are coupled to said suction unit and said supporting arm so that said suction unit is pressed towards the mask film by said elastic material; and said stopper supporting unit comprises a stopper arm retractable horizontally, and a stopper arm driving unit for driving said stopper arm; and said suction unit slid along said guide unit is fixed and supported by said stopper arm at a predetermined position.

3. An exposing apparatus with mask alignment system according to claim 1, wherein said image-taking means provided in said alignment stage comprises two cameras, and a lightning device for irradiating focal points of said cameras, said cameras being supported with a supporting member, said supporting member being provided on a slide unit which is provided along the longitudinal direction of a movable arm so as to be movable, a proximal portion of said movable arm being provided at a horizontal groove perpendicular to the longitudinal direction of said movable arm; and said lightning device is provided at a predetermined position of said supporting member so as to be moved up and down, and said lightning device irradiates locating marks of the work and the mask film when said lightning device is moved to the lowest position while said camera takes the images of the work and mask.

4. An exposing apparatus with mask alignment system according to claim 1, wherein a lower frame plate mounting the work comprises protrusions to be in contact with the side faces of the work at a predetermined position; and a lightning device for pinpointing a locating mark of the work with collimated light, provided in the vicinity of said image-taking means.

5. An exposing apparatus with mask alignment system according to claim 1, wherein said light source device of said exposing apparatus is provided in a housing adjacent to said exposing stage; and said housing further comprises a cooling device having a radiator, a reflector for reflecting light emitted from a lamp of said light source device in a predetermined direction, and a flyeye lens for adjusting illuminance of light; and said exposing stage further comprises a reflector having a curved surface for reflecting vertical collimated light to the work to be set in an exposure position; and the center of said light source device is arranged at a position deviated right or left from the center of the width of said exposing apparatus; and a first reflector for reflecting light emitted from said lamp at a predetermined angle reflects the light to a direction parallel to one end face of the work and closer to the work than a plane perpendicular to an optical axis of the light emitted from the lamp.

6. An exposing apparatus with mask alignment system comprising an alignment stage for aligning a work with a mask film, an exposing stage for exposing the aligned work, a transferring mechanism for transferring the work between said alignment stage and said exposing stage, a light source device for irradiating the work with light in said exposing stage, and image-taking means for taking images of the work and the mask film from the top of the work and the mask film in said alignment stage, said exposing apparatus with mask alignment system comprising:

said transferring mechanism comprising:
upper and lower transferring paths provided horizontally between said alignment stage and said exposing stage; and
an operating device for operating first and second movable tables carrying first and second lower frame plates to be moved along said transferring paths;

an alignment table to be lifted up from the bottom of said transferring paths to the top of the transferring paths, provided in said alignment stage;

a vertical transferring table to be lifted up from the bottom of said transferring paths to the top of the transferring paths, provided in said exposing stage; and upper transparent frame plates for forming a vacuum frame when combined with said respective first and second lower frame plates, provided in said exposing stage;

said movable table further comprising:
a mounting plate for mounting said lower frame plate; and a positioning guide for said lower frame plate provided at the predetermined position of said mounting plate.

7. An exposing apparatus with mask alignment system according to claim 6, wherein said positioning guide comprises rotative rollers at predetermined positions of said mounting plate; and said rotative rollers are brought into contact with respective side faces of the lower frame plate to be mounted on said mounting plate.

8. An exposing apparatus with mask alignment system according to claim 6, wherein said image-taking means provided in said alignment stage comprises two cameras, and a lightning device for irradiating focal points of said cameras, said cameras being supported with a supporting member, said supporting member being provided on a slide unit which is provided along the longitudinal direction of a movable arm so as to be movable, a proximal portion of said movable arm being provided at a horizontal groove perpendicular to the longitudinal direction of said movable arm; and said lightning device is provided at a predetermined position of said supporting member so as to be moved up and down, and said lightning device irradiates locating marks of the work and the mask film when said lightning device is moved to the lowest position while said camera takes the images of the work and mask.

9. An exposing apparatus with mask alignment system according to claim 6, wherein said lower frame plate mounting the work comprises protrusions to be in contact with the side faces of the work at a predetermined position; and a lightning device for pinpointing a locating mark of the work with collimated light, provided in the vicinity of said image-taking means.

10. An exposing apparatus with mask alignment system according to claim 6, wherein said light source device of said exposing apparatus is provided in a housing adjacent to said exposing stage; and said housing further comprises a cooling device having a radiator, a reflector for reflecting light emitted from a-lamp of said light source device in a predetermined direction, and a flyeye lens for adjusting illuminance of light; and said exposing stage further comprises a reflector having a curved surface for reflecting vertical collimated light to the work to be set in an exposure position; and the center of said light source device is arranged at a position deviated right or left from the center of the width of said exposing apparatus; and a first reflector for reflecting light emitted from said lamp at a predetermined angle reflects the light to a direction parallel to one end face of the work and closer to the work than a plane perpendicular to an optical axis of the light emitted from the lamp.

11. A method of aligning a work comprising:

a first step of separating a lower frame plate from a movable table as an alignment table is lifted up and mounting said lower frame plate on said alignment table when said movable table for transferring the lower frame plate along transferring paths provided horizontally at different height is moved to a distal end;

a second step of mounting the work on the lower frame plate by bringing end faces of the work into contact with protrusions provided along sides of said lower frame plate and aligning locating marks of the work with pinpointing collimated beams;

a third step of mounting a mask film on the work by aligning said locating marks of the mask film with said collimated beams for prealignment;

a fourth step of performing an alignment process by taking the images of said locating marks of the work and the mask film by image-taking means, lowering a retaining mechanism towards the mask film to suck the mask film, lifting up said retaining mechanism to separate the mask film from the work, operating said alignment table in X-, Y- and θ-directions in accordance with the locations of said locating marks; and a fifth step of lowering said retaining mechanism to bring the mask film in contact with the work, fixing and holding the work and the mask film on said lower frame, releasing the suction of said retaining mechanism, and lifting up said retaining mechanism.

12. A method of exposing a work comprising:

a first step of separating and lifting up a lower frame plate holding aligned work and mask film from a movable table as a vertical transferring table is lifted up, and combining the lower frame plate with ant upper transparent frame plate provided above the work and mask when said movable table for transferring the lower frame plate along transferring paths provided horizontally at different height is moved to a distal end;

a second step of exposing the work with a predetermined pattern of the mask film by irradiating the work with light from a light source device through an optical system; and a third step of separating the lower frame plate from the upper transparent frame plate and mounting the lower frame plate on the movable table as the vertical transferring table is lowered.

13. A method of transferring a work comprising:

a first step of moving one of lower frames mounted on respective first and second movable tables towards an alignment table in an alignment stage and moving the other lower frame towards a vertical transferring table in an exposing stage by moving said first and second movable tables along transferring paths provided at different height between said alignment stage and said exposing stage;

a second step of, in said alignment stage, separating and lifting up the lower frame from the first movable table as the alignment table is lifted up, aligning a work with a mask film by operating the alignment table with a retaining mechanism for aligning the mask film, and fixing the work and the mask film on the lower frame with fixing means, and in said exposing stage, separating and lifting up a lower frame plate holding the aligned work from the second movable table as the vertical transferring table is lifted up, combining the lower frame plate with an upper transparent frame plate provided above the lower frame to sandwich the work and the mask film, and vacuum-sucking the work and the mask film;

a third step of, in said alignment stage, lowering the lower frame holding the aligned work and mask film as the alignment table is lowered and mounting the lower frame on the first movable table, and in said exposing stage, releasing the vacuum-suction of the vacuum frame, lowering the lower frame holding the exposed work and mask film as the vertical transferring table is lowered and mounting the lower frame on the second movable table; and a fourth step of transferring the first movable table from said alignment stage to said exposing stage along said transferring paths, and transferring the second movable table from said exposing stage to said alignment stage.

\* \* \* \* \*